United States Patent
Moran et al.

(10) Patent No.: US 9,893,223 B2
(45) Date of Patent: Feb. 13, 2018

(54) SOLAR ELECTRICITY GENERATION SYSTEM

(75) Inventors: Rani Moran, Rehovot (IL); Haim Chayet, Nes Ziona (IL); Ori Kost, Omer (IL)

(73) Assignee: SUNCORE PHOTOVOLTAICS, INC., Albuquerque, NM (US)

( * ) Notice: Subject to any disclaimer, the term of this patent is extended or adjusted under 35 U.S.C. 154(b) by 1822 days.

(21) Appl. No.: 12/947,483

(22) Filed: Nov. 16, 2010

(65) Prior Publication Data
US 2012/0118351 A1  May 17, 2012

(51) Int. Cl.
*H01L 31/052* (2014.01)
*H01L 31/054* (2014.01)
*F24J 2/10* (2006.01)

(52) U.S. Cl.
CPC ......... *H01L 31/0547* (2014.12); *F24J 2/1047* (2013.01); *F24J 2002/1014* (2013.01); *Y02E 10/52* (2013.01)

(58) Field of Classification Search
USPC ........................................................ 136/246
See application file for complete search history.

(56) References Cited

U.S. PATENT DOCUMENTS

| | | |
|---|---|---|
| 514,669 A | 2/1894 | Allingham |
| 2,751,816 A | 6/1956 | Strong |
| 2,904,612 A | 9/1959 | Regnier |
| 2,946,945 A | 7/1960 | Regnier et al. |
| 3,018,313 A | 1/1962 | Gattone |
| 3,070,699 A | 12/1962 | Lehmann et al. |
| 3,071,667 A | 1/1963 | Lee |
| 3,134,906 A | 5/1964 | Henker |
| 3,152,260 A | 10/1964 | Cummings |
| 3,152,926 A | 10/1964 | Power |
| 3,186,873 A | 6/1965 | Dunlap |
| 3,232,795 A | 2/1966 | Gillette et al. |
| 3,350,234 A | 10/1967 | Ule |
| 3,358,332 A | 12/1967 | Downey |
| 3,369,939 A | 2/1968 | Myer |

(Continued)

FOREIGN PATENT DOCUMENTS

| | | |
|---|---|---|
| EP | 1 953 830 A2 | 8/2008 |
| JP | 58 135684 A | 8/1983 |

(Continued)

OTHER PUBLICATIONS

U.S. Appl. No. 11/852,595, filed Sep. 10, 2007, Tsadka et al.

(Continued)

*Primary Examiner* — Jennifer Michener
*Assistant Examiner* — Dustin Q Dam
(74) *Attorney, Agent, or Firm* — Mueting, Raasch & Gebhardt, P.A.

(57) ABSTRACT

A solar electricity generator including an array of photovoltaic power generating elements, and a single continuous smooth solar reflecting surface, the surface being arranged to reflect light from the sun onto the array of photovoltaic power generating elements, wherein the flux per area at a point of minimum flux per area on the array is approximately 75% of the flux per area at a point of maximum flux per area, the intercept factor of the array is at least 70%, and the optical fill factor of the array is at least 60%.

30 Claims, 28 Drawing Sheets

(56) References Cited

U.S. PATENT DOCUMENTS

| | | |
|---|---|---|
| 3,376,165 A | 4/1968 | Abbot |
| 3,383,246 A | 5/1968 | Ferreira |
| 3,392,304 A | 7/1968 | Anderson |
| 3,400,207 A | 9/1968 | Anderson |
| 3,419,434 A | 12/1968 | Colehower |
| 3,427,200 A | 2/1969 | Lapin et al. |
| 3,490,950 A | 1/1970 | Myer |
| 3,509,200 A | 4/1970 | Elpern et al. |
| 3,515,594 A | 6/1970 | Samuels |
| 3,523,721 A | 8/1970 | Hofmann |
| 3,532,551 A | 10/1970 | Webb |
| 3,544,913 A | 12/1970 | Anderson |
| 3,546,606 A | 12/1970 | Anderson et al. |
| 3,615,853 A | 10/1971 | Paine et al. |
| 3,713,727 A | 1/1973 | Markosian et al. |
| 3,748,536 A | 7/1973 | Andresen |
| 3,769,091 A | 10/1973 | Leinkram et al. |
| 3,783,231 A | 1/1974 | Sablev et al. |
| 3,793,179 A | 2/1974 | Sablev et al. |
| 3,833,425 A | 9/1974 | Leinkram et al. |
| 3,839,182 A | 10/1974 | Sager et al. |
| 3,900,279 A | 8/1975 | Newby et al. |
| 3,923,381 A | 12/1975 | Winston |
| 3,957,031 A | 5/1976 | Winston |
| 3,971,672 A | 7/1976 | Lampkin |
| 3,976,508 A | 8/1976 | Mlavsky |
| 3,977,773 A | 8/1976 | Hubbard |
| 3,977,904 A | 8/1976 | Kohler et al. |
| 3,986,021 A | 10/1976 | Hitchcock |
| 3,986,490 A | 10/1976 | Chao et al. |
| 3,988,166 A | 10/1976 | Beam |
| 3,990,914 A | 11/1976 | Weinstein et al. |
| 3,991,740 A | 11/1976 | Rabl |
| 3,994,012 A | 11/1976 | Warner, Jr. |
| 3,996,460 A | 12/1976 | Smith |
| 3,998,206 A | 12/1976 | Jahn |
| 3,999,283 A | 12/1976 | Dean et al. |
| 4,002,499 A | 1/1977 | Winston |
| 4,003,756 A | 1/1977 | Abrams |
| 4,007,729 A | 2/1977 | Chao et al. |
| 4,010,614 A | 3/1977 | Arthur |
| 4,011,854 A | 3/1977 | Brantley et al. |
| 4,017,332 A | 4/1977 | James |
| 4,021,267 A | 5/1977 | Dettling |
| 4,021,323 A | 5/1977 | Kilby et al. |
| 4,029,519 A | 6/1977 | Schertz et al. |
| 4,031,385 A | 6/1977 | Zerlaut et al. |
| 4,035,064 A | 7/1977 | Cowman, Jr. et al. |
| 4,042,417 A | 8/1977 | Kaplow et al. |
| 4,045,246 A | 8/1977 | Mlavsky et al. |
| 4,052,228 A | 10/1977 | Russell |
| 4,056,404 A | 11/1977 | Garone et al. |
| 4,056,405 A | 11/1977 | Varadi |
| 4,061,130 A | 12/1977 | Gonzalez |
| 4,062,698 A | 12/1977 | Blakeslee et al. |
| 4,069,812 A | 1/1978 | O'Neill |
| 4,075,034 A | 2/1978 | Butler |
| 4,078,944 A | 3/1978 | Mlavsky |
| 4,081,289 A | 3/1978 | Campbell, III |
| 4,082,570 A | 4/1978 | House et al. |
| 4,086,485 A | 4/1978 | Kaplow et al. |
| 4,090,359 A | 5/1978 | Doellner |
| 4,099,515 A | 7/1978 | Schertz |
| 4,103,151 A | 7/1978 | Chromie |
| 4,106,952 A | 8/1978 | Kravitz |
| 4,107,521 A | 8/1978 | Winders |
| 4,108,154 A | 8/1978 | Nelson |
| 4,114,592 A | 9/1978 | Winston |
| 4,115,149 A | 9/1978 | Bell |
| 4,116,718 A | 9/1978 | Yerkes et al. |
| 4,118,249 A | 10/1978 | Graven et al. |
| RE29,833 E | 11/1978 | Mlavsky |
| 4,128,732 A | 12/1978 | Kaplow et al. |
| 4,129,458 A | 12/1978 | Kaplow et al. |
| 4,130,107 A | 12/1978 | Rabl et al. |
| 4,131,485 A | 12/1978 | Meinel et al. |
| 4,132,223 A | 1/1979 | Reddell |
| 4,134,392 A | 1/1979 | Livermore et al. |
| 4,134,393 A | 1/1979 | Stark et al. |
| 4,140,142 A | 2/1979 | Dormidontov et al. |
| 4,143,234 A | 3/1979 | Johnson et al. |
| 4,146,407 A | 3/1979 | Litsenko et al. |
| 4,146,408 A | 3/1979 | Nelson |
| 4,146,784 A | 3/1979 | Yekutieli et al. |
| 4,146,785 A | 3/1979 | Neale |
| 4,147,561 A | 4/1979 | Knight et al. |
| 4,148,298 A | 4/1979 | Sherman, Jr. |
| 4,148,299 A | 4/1979 | Sherman, Jr. |
| 4,151,005 A | 4/1979 | Strebkov et al. |
| 4,152,174 A | 5/1979 | Ludlow |
| 4,153,474 A | 5/1979 | Rex et al. |
| 4,153,475 A | 5/1979 | Hider et al. |
| 4,153,476 A | 5/1979 | Frosch et al. |
| 4,158,356 A | 6/1979 | Wininger |
| 4,162,174 A | 7/1979 | Kaplow et al. |
| 4,162,928 A | 7/1979 | Frosch et al. |
| 4,167,936 A | 9/1979 | Hackworth |
| 4,168,696 A | 9/1979 | Kelly |
| 4,169,738 A | 10/1979 | Luque et al. |
| 4,172,739 A | 10/1979 | Tassen |
| 4,172,740 A | 10/1979 | Campbell, III |
| 4,173,213 A | 11/1979 | Kelly |
| 4,174,978 A | 11/1979 | Lidorenko et al. |
| 4,179,612 A | 12/1979 | Smith |
| 4,180,414 A | 12/1979 | Diamond et al. |
| 4,190,766 A | 2/1980 | Young |
| 4,191,593 A | 3/1980 | Cacheux et al. |
| 4,191,594 A | 3/1980 | Stark et al. |
| 4,192,289 A | 3/1980 | Clark |
| 4,195,913 A | 4/1980 | Dourte et al. |
| 4,198,826 A | 4/1980 | Chromie |
| 4,200,472 A | 4/1980 | Chappell et al. |
| 4,202,004 A | 5/1980 | Andersen |
| 4,204,881 A | 5/1980 | McGrew |
| 4,209,231 A | 6/1980 | Sayre |
| 4,209,346 A | 6/1980 | King |
| 4,209,347 A | 6/1980 | Klein |
| 4,210,463 A | 7/1980 | Escher |
| 4,213,303 A | 7/1980 | Lane |
| RE30,384 E | 8/1980 | Kaplow et al. |
| 4,223,174 A | 9/1980 | Moeller |
| 4,223,214 A | 9/1980 | Dorian et al. |
| 4,228,789 A | 10/1980 | Kay |
| 4,230,095 A | 10/1980 | Winston |
| 4,234,354 A | 11/1980 | Lidorenko et al. |
| 4,235,643 A | 11/1980 | Amick |
| 4,236,937 A | 12/1980 | Wihl |
| 4,237,332 A | 12/1980 | Winston |
| 4,238,265 A | 12/1980 | Deminet |
| 4,242,580 A | 12/1980 | Kaplow et al. |
| 4,245,153 A | 1/1981 | Porter |
| 4,245,895 A | 1/1981 | Wildenrotter et al. |
| 4,246,042 A | 1/1981 | Knasel et al. |
| 4,249,516 A | 2/1981 | Stark |
| 4,249,520 A | 2/1981 | Orillion |
| 4,253,895 A | 3/1981 | Chenault |
| 4,256,088 A | 3/1981 | Vindum |
| 4,262,195 A | 4/1981 | White et al. |
| 4,263,895 A | 4/1981 | Colao |
| 4,266,530 A | 5/1981 | Steadman |
| 4,276,122 A | 6/1981 | Snyder |
| 4,280,853 A | 7/1981 | Palazzeto et al. |
| 4,283,588 A | 8/1981 | Zitzelsberger et al. |
| 4,284,839 A | 8/1981 | Johnson |
| 4,289,920 A | 9/1981 | Hovel |
| 4,291,191 A | 9/1981 | Dahlberg et al. |
| 4,297,521 A | 10/1981 | Johnson |
| 4,300,533 A | 11/1981 | Sacco |
| 4,301,321 A | 11/1981 | Bartels |
| 4,304,955 A | 12/1981 | Meckler |
| 4,311,869 A | 1/1982 | Kurth et al. |
| 4,312,330 A | 1/1982 | Holdridge |
| 4,313,023 A | 1/1982 | Stephens |
| 4,314,546 A | 2/1982 | Miller |

(56) References Cited

U.S. PATENT DOCUMENTS

| | | |
|---|---|---|
| 4,316,084 A | 2/1982 | Stout |
| 4,316,448 A | 2/1982 | Dodge |
| 4,317,031 A | 2/1982 | Findell |
| 4,320,164 A | 3/1982 | Nicolas et al. |
| 4,320,288 A | 3/1982 | Schlarlack |
| 4,321,417 A | 3/1982 | Kurth et al. |
| 4,321,909 A | 3/1982 | Trihey et al. |
| 4,323,052 A | 4/1982 | Stark |
| 4,325,788 A | 4/1982 | Snyder |
| 4,328,389 A | 5/1982 | Stern et al. |
| 4,332,973 A | 6/1982 | Sater |
| 4,337,758 A | 7/1982 | Meinel et al. |
| 4,337,759 A | 7/1982 | Popovich et al. |
| 4,339,626 A | 7/1982 | Fisher et al. |
| 4,350,837 A | 9/1982 | Clark |
| 4,352,948 A | 10/1982 | Kaplow et al. |
| 4,354,115 A | 10/1982 | Warabisako et al. |
| 4,354,484 A | 10/1982 | Malone et al. |
| 4,355,630 A | 10/1982 | Fattor |
| 4,361,717 A | 11/1982 | Gilmore et al. |
| 4,361,758 A | 11/1982 | Rotolo |
| 4,367,366 A | 1/1983 | Bloss et al. |
| 4,367,403 A | 1/1983 | Miller |
| 4,374,955 A | 2/1983 | Gupta et al. |
| 4,376,228 A | 3/1983 | Fan et al. |
| 4,377,154 A | 3/1983 | Meckler |
| 4,379,324 A | 4/1983 | Thompson |
| 4,379,944 A | 4/1983 | Borden et al. |
| 4,388,481 A | 6/1983 | Uroshevich |
| 4,392,006 A | 7/1983 | Apelian |
| 4,395,581 A | 7/1983 | Girard et al. |
| 4,400,992 A | 8/1983 | Londres |
| 4,404,465 A | 9/1983 | Miller |
| 4,414,095 A | 11/1983 | Dickakian |
| 4,415,759 A | 11/1983 | Copeland et al. |
| 4,416,262 A | 11/1983 | Niedermeyer |
| 4,418,238 A | 11/1983 | Lidorenko et al. |
| 4,419,533 A | 12/1983 | Czubatyj et al. |
| 4,421,943 A | 12/1983 | Withjack |
| 4,423,719 A | 1/1984 | Hutchison |
| 4,424,802 A | 1/1984 | Winders |
| 4,427,838 A | 1/1984 | Goldman et al. |
| 4,429,178 A | 1/1984 | Prideaux et al. |
| 4,432,342 A | 2/1984 | Lucas et al. |
| 4,433,199 A | 2/1984 | Middy |
| 4,442,348 A | 4/1984 | Snyder |
| 4,448,659 A | 5/1984 | Morrison, Jr. |
| 4,448,799 A | 5/1984 | Bergman et al. |
| 4,454,371 A | 6/1984 | Folino |
| 4,456,783 A | 6/1984 | Baker |
| 4,463,749 A | 8/1984 | Sobczak et al. |
| 4,465,734 A | 8/1984 | Laroche et al. |
| 4,469,938 A | 9/1984 | Cohen |
| 4,476,853 A | 10/1984 | Arbogast |
| 4,477,052 A | 10/1984 | Knoblauch et al. |
| 4,482,778 A | 11/1984 | Anderson |
| 4,491,681 A | 1/1985 | Kirpich |
| 4,494,302 A | 1/1985 | Knechtli et al. |
| 4,500,167 A | 2/1985 | Mori et al. |
| 4,509,248 A | 4/1985 | Spitzer et al. |
| 4,510,385 A | 4/1985 | Welman |
| 4,511,755 A | 4/1985 | Mori et al. |
| 4,516,018 A | 5/1985 | Bodenheimer et al. |
| 4,519,384 A | 5/1985 | Murtha |
| 4,529,829 A | 7/1985 | Yamazaki et al. |
| 4,529,830 A | 7/1985 | Daniel |
| 4,547,432 A | 10/1985 | Pitts et al. |
| 4,556,788 A | 12/1985 | Hanak |
| 4,557,569 A | 12/1985 | Hacskaylo |
| 4,559,125 A | 12/1985 | Mularie |
| 4,559,926 A | 12/1985 | Butler |
| 4,567,316 A | 1/1986 | Hollaus et al. |
| 4,586,488 A | 5/1986 | Noto |
| 4,593,152 A | 6/1986 | Yamazaki et al. |
| 4,594,470 A | 6/1986 | Headrick |
| 4,604,494 A | 8/1986 | Shepard, Jr. |
| 4,611,914 A | 9/1986 | Homma et al. |
| 4,612,488 A | 9/1986 | Uhlemann et al. |
| 4,620,913 A | 11/1986 | Bergman |
| 4,622,432 A | 11/1986 | Yamazaki et al. |
| 4,628,142 A | 12/1986 | Hashizume et al. |
| 4,633,030 A | 12/1986 | Cook |
| 4,636,579 A | 1/1987 | Hanak et al. |
| 4,638,110 A | 1/1987 | Erbert |
| 4,643,524 A | 2/1987 | Mori et al. |
| 4,649,900 A | 3/1987 | Trihey et al. |
| 4,658,805 A | 4/1987 | Robbins, Jr. |
| 4,668,841 A | 5/1987 | Headrick |
| 4,670,622 A | 6/1987 | Livingston, Jr. |
| 4,672,191 A | 6/1987 | Cofield |
| 4,677,248 A | 6/1987 | Lacey |
| 4,682,865 A | 7/1987 | Rogers et al. |
| 4,683,348 A | 7/1987 | Pidgeon et al. |
| 4,687,880 A | 8/1987 | Morris |
| 4,691,075 A | 9/1987 | Murphy |
| 4,692,683 A | 9/1987 | Lalmond |
| 4,696,554 A | 9/1987 | Seawright |
| 4,700,690 A | 10/1987 | Strickland |
| 4,710,588 A | 12/1987 | Ellion |
| 4,711,972 A | 12/1987 | O'Neill |
| 4,716,258 A | 12/1987 | Murtha |
| 4,719,903 A | 1/1988 | Powell |
| 4,724,010 A | 2/1988 | Okaniwa et al. |
| 4,728,878 A | 3/1988 | Anthony |
| 4,746,370 A | 5/1988 | Woolf |
| 4,765,726 A | 8/1988 | Johnson |
| 4,771,764 A | 9/1988 | Cluff |
| 4,783,373 A | 11/1988 | Baumeister et al. |
| 4,784,700 A | 11/1988 | Stern et al. |
| 4,789,408 A | 12/1988 | Fitzsimmons |
| 4,800,868 A | 1/1989 | Appeldorn et al. |
| 4,832,002 A | 5/1989 | Medina |
| 4,834,805 A | 5/1989 | Erbert |
| 4,836,861 A | 6/1989 | Peltzer et al. |
| 4,863,224 A | 9/1989 | Afian et al. |
| 4,868,379 A | 9/1989 | West |
| 4,883,340 A | 11/1989 | Dominguez |
| 4,888,063 A | 12/1989 | Powell |
| 4,892,593 A | 1/1990 | Lew |
| 4,919,527 A | 4/1990 | Saiylov et al. |
| 4,927,770 A | 5/1990 | Swanson |
| 4,943,325 A | 7/1990 | Levy |
| 4,963,012 A | 10/1990 | Tracy et al. |
| 4,964,713 A | 10/1990 | Goetzberger et al. |
| 4,968,355 A | 11/1990 | Johnson |
| 5,022,929 A | 6/1991 | Gallois-Montbrun et al. |
| 5,071,596 A | 12/1991 | Goela et al. |
| 5,086,828 A | 2/1992 | Ewert |
| 5,089,055 A | 2/1992 | Nakamura |
| 5,091,018 A | 2/1992 | Fraas et al. |
| 5,096,505 A | 3/1992 | Fraas et al. |
| 5,107,086 A | 4/1992 | Yangas |
| 5,118,361 A | 6/1992 | Fraas et al. |
| 5,123,968 A | 6/1992 | Fraas et al. |
| 5,125,983 A | 6/1992 | Cummings |
| 5,148,012 A | 9/1992 | Carter |
| 5,153,780 A | 10/1992 | Jorgensen et al. |
| 5,154,777 A | 10/1992 | Blackmon et al. |
| 5,167,724 A | 12/1992 | Chiang |
| 5,169,456 A | 12/1992 | Johnson |
| 5,217,539 A | 6/1993 | Fraas et al. |
| 5,227,618 A | 7/1993 | Shingleton |
| 5,228,926 A | 7/1993 | Glatfelter et al. |
| 5,244,509 A | 9/1993 | Arao et al. |
| 5,255,666 A | 10/1993 | Curchod |
| 5,259,679 A | 11/1993 | Hwang |
| 5,261,970 A | 11/1993 | Landis et al. |
| 5,268,037 A | 12/1993 | Glatfelter |
| 5,269,851 A | 12/1993 | Horne |
| 5,272,356 A | 12/1993 | Wen et al. |
| 5,272,570 A | 12/1993 | Yoshida et al. |
| 5,312,521 A | 5/1994 | Fraas et al. |
| 5,317,145 A | 5/1994 | Corio |
| 5,322,572 A | 6/1994 | Wanlass |

(56) References Cited

U.S. PATENT DOCUMENTS

| | | |
|---|---|---|
| 5,344,497 A | 9/1994 | Fraas et al. |
| 5,347,402 A | 9/1994 | Arbogast |
| 5,353,735 A | 10/1994 | Arai et al. |
| 5,374,317 A | 12/1994 | Lamb et al. |
| 5,379,596 A | 1/1995 | Grayson |
| 5,383,976 A | 1/1995 | Fraas et al. |
| 5,385,615 A | 1/1995 | Home |
| 5,393,970 A | 2/1995 | Shau et al. |
| 5,404,869 A | 4/1995 | Parkyn, Jr. et al. |
| 5,409,550 A | 4/1995 | Safir et al. |
| 5,437,736 A | 8/1995 | Cole |
| 5,445,177 A | 8/1995 | Laing et al. |
| 5,460,659 A | 10/1995 | Krut |
| 5,493,824 A | 2/1996 | Webster et al. |
| 5,496,414 A | 3/1996 | Harvey et al. |
| 5,498,297 A | 3/1996 | O'Neill et al. |
| 5,505,789 A | 4/1996 | Fraas et al. |
| 5,512,742 A | 4/1996 | Mattson |
| 5,529,054 A | 6/1996 | Shoen |
| 5,538,563 A | 7/1996 | Finkl |
| 5,560,700 A | 10/1996 | Levens |
| 5,575,861 A | 11/1996 | Younan et al. |
| 5,577,492 A | 11/1996 | Parkyn, Jr. et al. |
| 5,578,139 A | 11/1996 | Jones et al. |
| 5,578,140 A | 11/1996 | Yogev et al. |
| 5,614,033 A | 3/1997 | Robinson et al. |
| 5,632,823 A | 5/1997 | Sharan et al. |
| 5,646,397 A | 7/1997 | Wenham et al. |
| 5,658,448 A | 8/1997 | Lasich et al. |
| 5,660,644 A | 8/1997 | Clemens |
| 5,704,701 A | 1/1998 | Kavanagh et al. |
| 5,716,442 A | 2/1998 | Fertig |
| 5,727,585 A | 3/1998 | Daume et al. |
| 5,851,309 A | 12/1998 | Kousa |
| 5,877,874 A | 3/1999 | Rosenberg |
| 5,902,417 A | 5/1999 | Lillington et al. |
| 5,919,314 A | 7/1999 | Kim et al. |
| 5,936,193 A | 8/1999 | Parise |
| 5,959,787 A | 9/1999 | Fairbanks |
| 5,979,834 A | 11/1999 | Falbel |
| 5,994,641 A | 11/1999 | Kardauskas |
| 6,008,449 A | 12/1999 | Cole |
| 6,011,215 A | 1/2000 | Glatfelter et al. |
| 6,015,950 A | 1/2000 | Converse |
| 6,015,951 A | 1/2000 | Ikai et al. |
| 6,020,553 A | 2/2000 | Yogev et al. |
| 6,020,554 A | 2/2000 | Kaminar et al. |
| 6,034,319 A | 3/2000 | Falbel |
| 6,036,323 A | 3/2000 | Meijer |
| 6,043,425 A | 3/2000 | Assad |
| 6,057,505 A | 5/2000 | Ortabasi |
| 6,061,181 A | 5/2000 | Fereidooni |
| 6,067,982 A | 5/2000 | Harrison et al. |
| 6,073,500 A | 6/2000 | Jorgensen et al. |
| 6,075,200 A | 6/2000 | O'Neill |
| 6,080,927 A | 6/2000 | Johnson |
| 6,091,020 A | 7/2000 | Fairbanks et al. |
| 6,111,190 A | 8/2000 | O'Neill |
| 6,140,570 A | 10/2000 | Kariya |
| 6,162,985 A | 12/2000 | Parise |
| 6,178,707 B1 | 1/2001 | Bengtson |
| 6,188,012 B1 | 2/2001 | Ralph |
| 6,196,216 B1 | 3/2001 | Kooij et al. |
| 6,201,181 B1 | 3/2001 | Azzam et al. |
| 6,207,890 B1 | 3/2001 | Nakai et al. |
| 6,225,551 B1 | 5/2001 | Lewandowski et al. |
| 6,227,673 B1 | 5/2001 | O'Hara-Smith |
| 6,239,354 B1 | 5/2001 | Wanlass |
| 6,252,155 B1 | 6/2001 | Ortabasi |
| 6,265,242 B1 | 7/2001 | Komori et al. |
| 6,265,653 B1 | 7/2001 | Haigh et al. |
| 6,268,558 B1 | 7/2001 | Kubota |
| 6,281,485 B1 | 8/2001 | Siri |
| 6,284,968 B1 | 9/2001 | Niesyn |
| 6,291,761 B1 | 9/2001 | Takada et al. |
| 6,323,415 B1 | 11/2001 | Uematsu et al. |
| 6,333,458 B1 | 12/2001 | Forrest et al. |
| 6,349,718 B1 | 2/2002 | Ven et al. |
| 6,365,823 B1 | 4/2002 | Kondo |
| 6,367,259 B1 | 4/2002 | Timm |
| 6,372,978 B1 | 4/2002 | Cifaldi |
| 6,380,479 B2 | 4/2002 | Nakai et al. |
| 6,384,318 B1 | 5/2002 | Nomura |
| 6,384,320 B1 | 5/2002 | Chen |
| 6,407,328 B2 | 6/2002 | Kleinwachter et al. |
| 6,441,298 B1 | 8/2002 | Thio |
| 6,443,145 B1 | 9/2002 | Buron et al. |
| 6,452,089 B1 | 9/2002 | Kubota et al. |
| 6,469,241 B1 | 10/2002 | Penn |
| 6,472,593 B1 | 10/2002 | Middelman et al. |
| 6,476,312 B1 | 11/2002 | Barnham |
| 6,481,859 B1 | 11/2002 | Moseshvili |
| 6,489,553 B1 | 12/2002 | Fraas et al. |
| 6,498,290 B1 | 12/2002 | Lawheed |
| 6,515,217 B1 | 2/2003 | Aylaian |
| 6,525,264 B2 | 2/2003 | Ouchida et al. |
| 6,528,716 B2 | 3/2003 | Collette et al. |
| 6,530,369 B1 | 3/2003 | Yogev et al. |
| 6,532,953 B1 | 3/2003 | Blackmon et al. |
| 6,541,694 B2 | 4/2003 | Winston et al. |
| 6,548,751 B2 | 4/2003 | Sverdrup, Jr. et al. |
| 6,552,257 B1 | 4/2003 | Hart et al. |
| 6,557,804 B1 | 5/2003 | Carroll |
| 6,559,371 B2 | 5/2003 | Shingleton et al. |
| 6,580,027 B2 | 6/2003 | Forrest et al. |
| 6,583,349 B2 | 6/2003 | Tanaka |
| 6,597,709 B1 | 7/2003 | Diver, Jr. |
| 6,604,436 B1 | 8/2003 | Lewandowski et al. |
| 6,607,936 B2 | 8/2003 | Nomura et al. |
| 6,620,995 B2 | 9/2003 | Vasylyev et al. |
| 6,653,551 B2 | 11/2003 | Chen |
| 6,653,552 B2 | 11/2003 | Sugarwara et al. |
| 6,661,818 B1 | 12/2003 | Feldman et al. |
| 6,686,533 B2 | 2/2004 | Baum et al. |
| 6,689,949 B2 | 2/2004 | Ortabasi |
| 6,696,637 B2 | 2/2004 | Lawheed |
| 6,700,054 B2 | 3/2004 | Cherney et al. |
| 6,700,055 B2 | 3/2004 | Barone |
| 6,704,607 B2 | 3/2004 | Stone et al. |
| 6,713,668 B2 | 3/2004 | Akamatsu et al. |
| 6,717,045 B2 | 4/2004 | Chen |
| 6,730,840 B2 | 5/2004 | Sasaoka et al. |
| 6,750,392 B1 | 6/2004 | Yen et al. |
| 6,774,299 B2 | 8/2004 | Ford |
| 6,799,742 B2 | 10/2004 | Nakamura et al. |
| 6,800,801 B2 | 10/2004 | Sasaoka et al. |
| 6,803,514 B2 | 10/2004 | Takeyama et al. |
| 6,818,818 B2 | 11/2004 | Bareis |
| 6,820,509 B2 | 11/2004 | Lewandowski et al. |
| 6,828,499 B2 | 12/2004 | Max |
| 6,831,221 B2 | 12/2004 | Hulen |
| 6,870,087 B1 | 3/2005 | Gallagher |
| 6,881,893 B1 | 4/2005 | Cobert |
| 6,897,423 B2 | 5/2005 | Redler et al. |
| 6,945,063 B2 | 9/2005 | Max |
| 6,953,038 B1 | 10/2005 | Nohrig |
| 6,974,904 B2 | 12/2005 | Azzam et al. |
| 6,999,221 B1 | 2/2006 | Sarkisov et al. |
| 7,076,965 B2 | 7/2006 | Lasich |
| 7,077,532 B1 | 7/2006 | Diver, Jr. et al. |
| 7,081,584 B2 | 7/2006 | Mook |
| 7,109,461 B2 | 9/2006 | Lasich et al. |
| 7,166,797 B1 | 1/2007 | Dziendziel et al. |
| 7,173,179 B2 | 2/2007 | Nicoletti et al. |
| 2001/0007261 A1 | 7/2001 | Kleinwachter |
| 2001/0008143 A1 | 7/2001 | Sasaoka et al. |
| 2001/0008144 A1 | 7/2001 | Uematsu et al. |
| 2001/0011551 A1 | 8/2001 | Peumans |
| 2001/0036024 A1 | 11/2001 | Wood |
| 2002/0007845 A1 | 1/2002 | Collette et al. |
| 2002/0062856 A1 | 5/2002 | Wescott |
| 2002/0075579 A1 | 6/2002 | Vasylyev et al. |
| 2002/0121298 A1 | 9/2002 | Konold |
| 2002/0139414 A1 | 10/2002 | Vasylyev et al. |

(56) References Cited

U.S. PATENT DOCUMENTS

| | | |
|---|---|---|
| 2002/0179138 A1 | 12/2002 | Lawheed |
| 2002/0189662 A1 | 12/2002 | Lomparski |
| 2003/0000567 A1 | 1/2003 | Lynn |
| 2003/0015233 A1 | 1/2003 | Barone |
| 2003/0016457 A1 | 1/2003 | Woodall |
| 2003/0034063 A1 | 2/2003 | Winston |
| 2003/0047208 A1 | 3/2003 | Glenn |
| 2003/0051750 A1 | 3/2003 | Lawheed |
| 2003/0070704 A1 | 4/2003 | Hart et al. |
| 2003/0075212 A1 | 4/2003 | Chen |
| 2003/0075213 A1 | 4/2003 | Chen |
| 2003/0111104 A1 | 6/2003 | Akamatsu |
| 2003/0116184 A1 | 6/2003 | Derby-Lewis |
| 2003/0137754 A1 | 7/2003 | Vasylyev |
| 2003/0140960 A1 | 7/2003 | Baum |
| 2003/0156337 A1 | 8/2003 | Davidson |
| 2003/0201007 A1 | 10/2003 | Fraas et al. |
| 2003/0201008 A1 | 10/2003 | Lawheed |
| 2003/0213514 A1 | 11/2003 | Ortabasi |
| 2004/0011395 A1 | 1/2004 | Nicoletti |
| 2004/0021964 A1 | 2/2004 | Rabinowitz |
| 2004/0025931 A1 | 2/2004 | Aguglia |
| 2004/0031517 A1 | 2/2004 | Bareis |
| 2004/0045596 A1 | 3/2004 | Lawheed |
| 2004/0079863 A1 | 4/2004 | Lasich |
| 2004/0084077 A1 | 5/2004 | Aylaian |
| 2004/0085695 A1 | 5/2004 | Skauen |
| 2004/0095658 A1 | 5/2004 | Buretea et al. |
| 2004/0103938 A1 | 6/2004 | Rider |
| 2004/0112373 A1 | 6/2004 | Djeu |
| 2004/0112424 A1 | 6/2004 | Araki |
| 2004/0118449 A1 | 6/2004 | Murphy |
| 2004/0123895 A1 | 7/2004 | Karsauskas |
| 2004/0134531 A1 | 7/2004 | Habraken |
| 2004/0163697 A1 | 8/2004 | Papadopoulos |
| 2004/0163699 A1 | 8/2004 | Boulanger |
| 2004/0173256 A1 | 9/2004 | Kageyama |
| 2004/0173257 A1 | 9/2004 | Rogers |
| 2004/0187906 A1 | 9/2004 | Boulanger |
| 2004/0187907 A1 | 9/2004 | Morgal |
| 2004/0187908 A1 | 9/2004 | Muhs |
| 2004/0187913 A1 | 9/2004 | Okada |
| 2004/0194820 A1 | 10/2004 | Barone |
| 2004/0231715 A1 | 11/2004 | Pagel |
| 2004/0231716 A1 | 11/2004 | Litwin |
| 2004/0238025 A1 | 12/2004 | Shingleton |
| 2005/0022858 A1 | 2/2005 | Terao |
| 2005/0034751 A1 | 2/2005 | Gross |
| 2005/0034752 A1 | 2/2005 | Gross et al. |
| 2005/0039788 A1 | 2/2005 | Blieske |
| 2005/0039791 A1 | 2/2005 | Johnson |
| 2005/0046977 A1 | 3/2005 | Shifman |
| 2005/0081908 A1 | 4/2005 | Stewart |
| 2005/0081909 A1 | 4/2005 | Paull |
| 2005/0091979 A1 | 5/2005 | Bareis |
| 2005/0092360 A1 | 5/2005 | Clark |
| 2005/0121071 A1 | 6/2005 | Repetto |
| 2005/0133082 A1 | 6/2005 | Konold |
| 2005/0161074 A1 | 7/2005 | Garvison |
| 2005/0166953 A1 | 8/2005 | Baldeschwieler |
| 2005/0178427 A1 | 8/2005 | Kelly et al. |
| 2005/0225885 A1 | 10/2005 | Wright |
| 2006/0021648 A1 | 2/2006 | Parise |
| 2006/0037639 A1 | 2/2006 | Hihi |
| 2006/0054211 A1 | 3/2006 | Meyers |
| 2006/0054212 A1 | 3/2006 | Fraas et al. |
| 2006/0072222 A1 | 4/2006 | Lichy |
| 2006/0076048 A1 | 4/2006 | Gaudiana |
| 2006/0086382 A1 | 4/2006 | Plaisted |
| 2006/0086383 A1 | 4/2006 | Ruelle |
| 2006/0086838 A1 | 4/2006 | Waznys |
| 2006/0090789 A1 | 5/2006 | Thompson |
| 2006/0107992 A1 | 5/2006 | Karnaukhov et al. |
| 2006/0124166 A1 | 6/2006 | Romijn |
| 2006/0130892 A1 | 6/2006 | Algora |
| 2006/0137733 A1 | 6/2006 | Schripsema et al. |
| 2006/0137734 A1 | 6/2006 | Mortenson |
| 2006/0151022 A1 | 7/2006 | Lawheed |
| 2006/0162762 A1 | 7/2006 | Gilman |
| 2006/0169315 A1 | 8/2006 | Levin |
| 2006/0174930 A1 | 8/2006 | Murphy et al. |
| 2006/0185713 A1 | 8/2006 | Mook, Jr. |
| 2006/0185726 A1 | 8/2006 | Rogers et al. |
| 2006/0191566 A1 | 8/2006 | Schaafsma |
| 2006/0193066 A1 | 8/2006 | Prueitt |
| 2006/0231133 A1 | 10/2006 | Fork et al. |
| 2006/0243319 A1 | 11/2006 | Kusek et al. |
| 2006/0266408 A1 | 11/2006 | Horne et al. |
| 2006/0283495 A1 | 12/2006 | Gibson |
| 2006/0283497 A1 | 12/2006 | Hines |
| 2007/0017567 A1 | 1/2007 | Gronet et al. |
| 2007/0023079 A1 | 2/2007 | Mills et al. |
| 2007/0023080 A1 | 2/2007 | Thurner et al. |
| 2007/0035267 A1 | 2/2007 | Vasylyev et al. |
| 2007/0251568 A1* | 11/2007 | Maeda .......................... 136/246 |
| 2008/0047605 A1* | 2/2008 | Benitez et al. ............... 136/259 |
| 2009/0065045 A1* | 3/2009 | Tsadka et al. ................ 136/246 |
| 2010/0252091 A1 | 10/2010 | Tsadka et al. |
| 2011/0083721 A1* | 4/2011 | Imani ........................... 136/246 |

FOREIGN PATENT DOCUMENTS

| | | |
|---|---|---|
| WO | WO 2008/013976 A2 | 1/2008 |
| WO | WO 2009/034573 A2 | 3/2009 |
| WO | WO 2010/003115 A1 | 1/2010 |
| WO | WO 2012/066539 A1 | 5/2012 |

OTHER PUBLICATIONS

U.S. Appl. No. 12/677,208, filed Sep. 10, 2008, Tsadka et al.
International Search Report issued Mar. 26, 2009, in United States, International Patent Application No. PCT/IL2008/001214, filed Sep. 10, 2008; 3 pgs.
International Search Report issued Apr. 17, 2012, in United States, International Patent Application No. PCT/IL11/00882, filed Nov. 11, 2011; 4 pgs.
Authier et al., "High Concentration Solar Collector of the Stepped Spherical Type: Optical Design Characteristics," *Applied Optics*, 1980; 19(20): pp. 3554-3561.
Hu et al., Chapter 5.1: "Solar Concentrators," *Solar Cells: From Basics to Advanced Systems*; New York, NY, McGraw-Hill; 1984; pp. 101-106. Obtained on the Internet < http://www.eecs.berkeley.edu/~hu/Solar-Cells-download.html>.
Kurzweg, "Characteristics of Axicon Concentrators for Use in Photovoltaic Energy Conversion," *Solar Energy*, 1980; 24: pp. 411-412.
Swanson, "Photovoltaic Dish Solar-Electric Generator," Proceedings of the Joint Crystal-line Cell Research, and Concentrator Collector Projects Review SAND88-0522, Scandia National Laboratories, Albuquerque, New Mexico; Jul. 1988; pp. 109-199.
European Patent Application No. 11 84 1045, filed Nov. 15, 2011: European Supplementary Search Report dated Mar. 8, 2017; 7 pages.
Israeli Patent Application No. 226387 (National Phase of PCT/IL2011/000882), Office Action dated Apr. 23, 2017, [English language translation included. ].

* cited by examiner

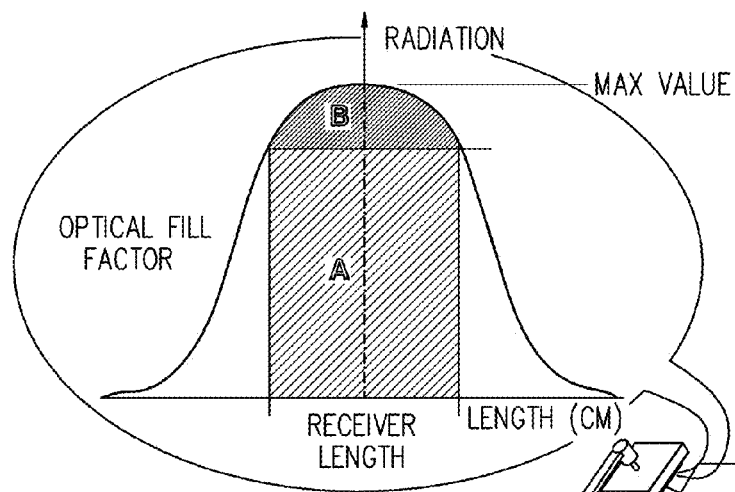
FIG. 1A
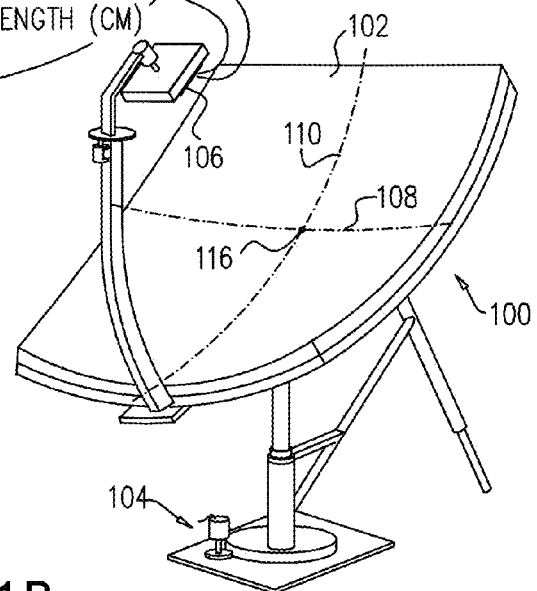
FIG. 1B
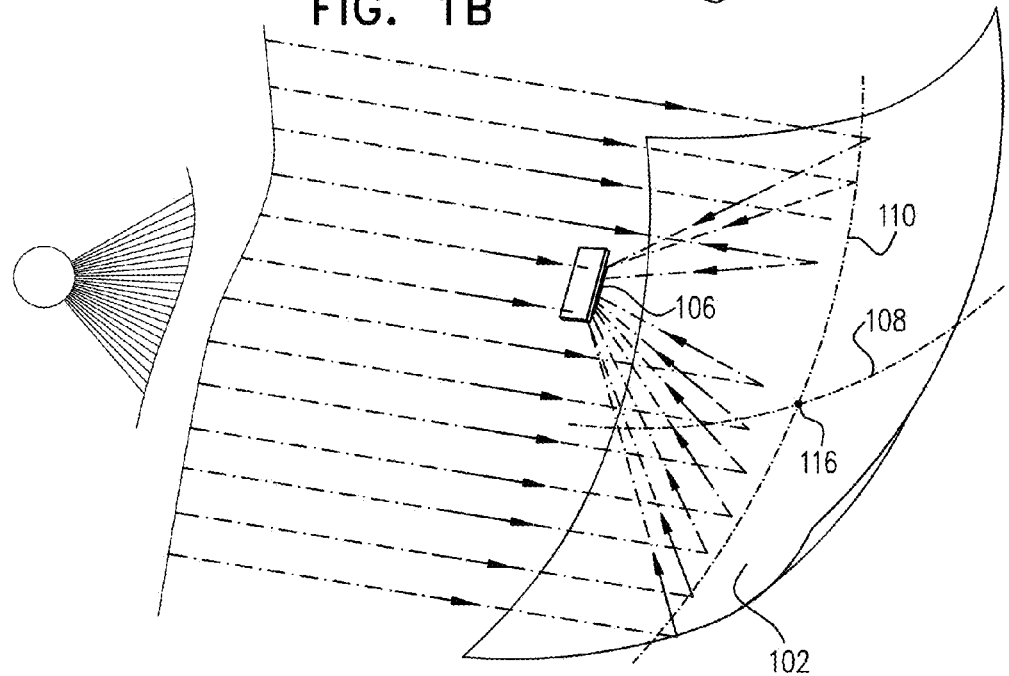

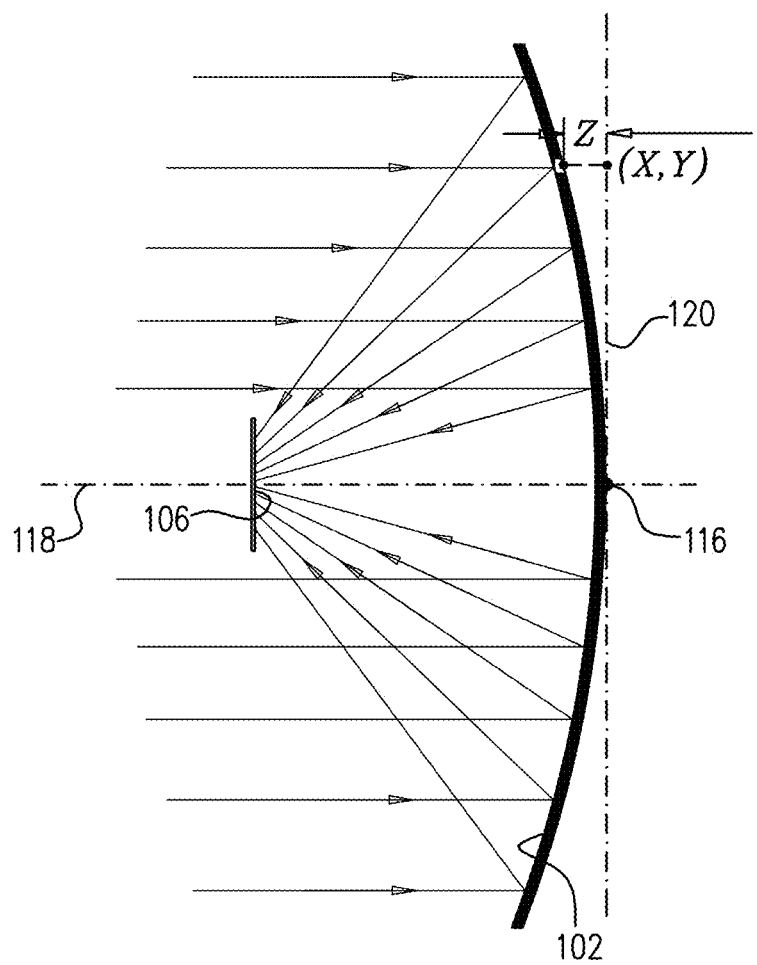

FIG. 1D

```
clear all
close all
deltax= 1e-3; deltay= 1e-3; % [m] grid resolution for surface defintion
lx=1.73; ly=1.73; rx= .06; ry=.06; % [m] half surface and receiver edges.
d=2; %[m] receiver distance along z axis from surface origin.

% leave a small gap between surface Qtrs.
shiftx= 10e-3; %[m]
shifty= 10e-3; %[m]
% grid for surface definition
x=( 0:deltax:lx)+ shiftx;
y=( 0:deltay:ly)+ shifty;
n_cov= .5; % 1 cover is a scanning of the reciever both ways (back and forth)
% a ray of light hitting the receiver on (x , y ,z) surface
% coordinates should be mapped to (x_star, y_star) - %receiver coordinates
x_star= rx*(n_times_cover(n_cov, (x-shiftx)/lx));
y_star= ry*(n_times_cover(n_cov, (y-shifty)/ly));
diff_x= x_star-x;
diff_y= y_star-y;

nx= length(x);
ny= length(y);

% surface z(x,y) and its numerical derivatives.
z= zeros(nx, ny);
dzdx= zeros(nx, ny);
dzdy= zeros(nx, ny);
% definition on edge z(:,1)
for k=1:nx
    denom= d-z(k,1) +norm([diff_x(k) diff_y(1) (d-z(k,1))]);
    dzdx(k, 1)= -diff_x(k)/denom; % partial derivative formula
    dzdy(k, 1)= -diff_y(1)/denom;% partial derivative formula
    if k~= nx
        z(k+1,1)= z(k,1)+ dzdx(k, 1)*deltax;
        % use x partial derivative to extend definition to next grid point
    end
end
clear('k')
```

TO FIG. 1E

FROM FIG. 1D

```
% definition on edge z(1, :)
for k=1:ny
    denom= d-z(1,k) +norm([diff_x(1) diff_y(k) (d-z(1,k))]);
    dzdx(1, k)= -diff_x(1)/denom;% partial derivative formula
    dzdy(1, k)= -diff_y(k)/denom;% partial derivative formula
    if k~= ny
        z(1, k+1)= z(1, k)+ dzdy(1, k)*deltay;
        % use y partial derivative to extend definition to next grid point
    end
end
clear('k')

% definition for interior points z(k,j), k,j>1
for kx= 2:nx
    for ky= 2:ny
        aprox_x= z(kx-1, ky)+ dzdx(kx-1, ky)* deltax;
        % use x partial derivative to extend definition to next grid point
        aprox_y= z(kx, ky-1)+ dzdy(kx, ky-1)* deltay;
        % use y partial derivative  to extend definition to next grid point
        z(kx, ky)= (aprox_x+ aprox_y)/2; % average both approximations
        denom= d-z(kx,ky) +norm([diff_x(kx) diff_y(ky) (d-z(kx,ky))]);
        dzdx(kx, ky)= -diff_x(kx)/denom; %partial derivative formula
        dzdy(kx, ky)= -diff_y(ky)/denom; %partial derivative formula
    end
end
clear('kx', 'ky')

% sample on "grid" the "piecwise linear" 1, 0, 1, 0, 1, 0,... function
% with absolute derivative 2n that goes from 1
% to 0 and back to 1 n times in the interval [0,1]
function y= n_times_cover(n, grid)
x= 0: 1/2/n: 1;
y= [ones(1,floor(n)); zeros(1,floor(n))];
y= y(:);
if n~= floor(n)
    y= [y; 1];
end
y=[0 y.'];
y= interp1(x,y,grid,'linear');
```

```
% the surface is described by z=z(x,y) ;
% x and y are positions on the axis with resolution of 1mm
% x,y,z are generated using the MATLAB instructions shown in Figs. 1D & 1E function flux= produce_surf_flux(x,y,z)

lx=1.73;  ly=1.73;              % half of surface length and width
rx= .06;  ry=.06;               % half of photovoltaic module length and width angleOfSun= 0.26*pi/180;        % "Half angle" of the sun.
deltax= 1e-3; deltay= 1e-3;     % grid resolution for surface defintion
d=2;                            % receiver distance along z axis from surface origin.
shift=10e-3;                    % leave a small gap between surface Qtrs.

[X,Y]= meshgrid(x,y);

% begin ray tracing simulation
n_rays= 1e6;                    % number of rays in simulation
lf= 450;                        % size of flux matrix flux= zeros(lf+1, lf+1);        % initialize % choose [x,y] points of rays impinging the surface
pts= [lx*rand(1, n_rays)+shift; ly*rand(1, n_rays)+shift];

% model sun as a uniform disc, and choose directions for the points of impingement
phi= sqrt(rand(1, n_rays))*angleOfSun;
theta= rand(1, n_rays)*2*pi;

% calc partial derivatives of surface
dzdy= [z(2,:)- z(1,:); (z(3:end,:)- z(1:end-2,:))/2; z(end,:)- z(end-1,:)]/deltax;
dzdx= [z(:,2)- z(:,1) (z(:,3:end)- z(:,1:end-2))/2 z(:,end)- z(:,end-1)]/deltay;

% interpolate z and derivatives to points of impingement
z_interp= interp2(X,Y,z,pts(1,:),pts(2,:), 'linear');
dzdx_interp= interp2(X,Y,dzdx,pts(1,:),pts(2,:), 'nearest');
dzdy_interp= interp2(X,Y,dzdy,pts(1,:),pts(2,:), 'nearest');
```

TO FIG. 1G

FROM FIG. 1F

```
for k=1:n_rays
    n= [-dzdx_interp(k), -dzdy_interp(k), 1]; % normal to surface
    n= n/norm(n);
    % vector that points to sun along impinging rays
    sun= [sin(phi(k))*cos(theta(k)) sin(phi(k))*sin(theta(k)) cos(phi(k))];
    % find vector u of reflected ray: u+sun= 2<sun,n>n
    u= 2* (sun*n.')*n- sun;
    % find t such that z_interp(k)+ t*u is in the receiver plane: z==d
    t= (d- z_interp(k))/u(3);
    if t<0 keyboard; end
    % find where the reflected ray hits the receiver plane
    hit= [pts(1,k) pts(2,k) z_interp(k)] + t*u;
    hit= round(hit*1000);
    flux(hit(1)+lf/2+1, hit(2)+lf/2+1)= flux(hit(1)+lf/2+1, hit(2)+lf/2+1)+ 1;
end % This is the flux for 1 quarter of the surface. The full surface is obtained by
% symmetry.
flux=flux+flux(end:-1:1,:)+flux(:, end:-1:1)+ flux(end:-1:1,end:-1:1);

% now calculate the fill factor for this flux
function fill_factor=calc_fill_factor(flux)

lx= 1.73; ly= lx;   % half of surface length and width
% sort all flux samples in decreasing order
flx= sort(flux(:));
flx= flx(end:-1:1).';

% use samples as successive thresholds: for each sample - if it is the threshold
% then only samples with a larger flux achieve it.
fill_vec= (flx.*(1:length(flx)))/sum(flx);

% The fill factor is the maximal element of fill_vec
[fill_factor, ind_max]= max(fill_vec);
```

```
clear all
close all deltax= 1e-3; deltay= 1e-3; % [m] grid resolution for surface defintion
lx=1.73; ly=1.73; rx= .06; ry=.06; % [m] half surface and receiver edges.
d=2; %[m] receiver distance along z axis from surface origin.
% leave a small gap between surface Qtrs.
shiftx= 10e-3; %[m]
shifty= 10e-3; %[m]
% grid for surface definition
x=( 0:deltax:lx)+ shiftx;
y=( 0:deltay:ly)+ shifty;
n_cov= .5; % 1 cover is a scanning of the reciever both ways (back and forth)
% a ray of light hitting the receiver on (x , y ,z) surface
%coordinates should be mapped to (x_star, y_star) -% receiver coordinates
x_star= 2*rx*(n_times_cover(n_cov, (x-shiftx)/lx)-.5);
y_star= 2*ry*(n_times_cover(n_cov, (y-shifty)/ly)-.5);
diff_x= x_star-x;
diff_y= y_star-y;

nx= length(x);
ny= length(y);

% surface z(x,y) and its numerical derivatives.
z= zeros(nx, ny);
dzdx= zeros(nx, ny);
dzdy= zeros(nx, ny);
% definition on edge z(:,1)
for k=1:nx
    denom= d-z(k,1) +norm([diff_x(k) diff_y(1) (d-z(k,1))]);
    dzdx(k, 1)= -diff_x(k)/denom; % partial derivative formula
    dzdy(k, 1)= -diff_y(1)/denom;% partial derivative formula
    if k~= nx
        z(k+1,1)= z(k,1)+ dzdx(k, 1)*deltax;
        % use x partial derivative to extend definition to next grid point
    end
end
clear('k')
```

TO FIG. 2E

FROM FIG. 2D

```
% definition on edge z(1, :)
for k=1:ny
    denom= d-z(1,k) +norm([diff_x(1) diff_y(k) (d-z(1,k))]);
    dzdx(1, k)= -diff_x(1)/denom;% partial derivative formula
    dzdy(1, k)= -diff_y(k)/denom;% partial derivative formula
    if k~= ny
        z(1, k+1)= z(1, k)+ dzdy(1, k)*deltay;
        % use y partioal derivative to extend definition to next grid point
    end
end
clear('k')
% definition for interior points z(k,j), k,j>1
for kx= 2:nx
    for ky= 2:ny
        aprox_x= z(kx-1, ky)+ dzdx(kx-1, ky)* deltax;
        % use x partial derivative to extend definition to next grid point
        aprox_y= z(kx, ky-1)+ dzdy(kx, ky-1)* deltay;
        % use y partial derivative  to extend definition to next grid point
        z(kx, ky)= (aprox_x+ aprox_y)/2; % average both approximations
        denom= d-z(kx,ky) +norm([diff_x(kx) diff_y(ky) (d-z(kx,ky))]);
        dzdx(kx, ky)= -diff_x(kx)/denom; %partial derivative formula
        dzdy(kx, ky)= -diff_y(ky)/denom; %partial derivative formula
    end
end
clear('kx', 'ky')
% sample on "grid" the "piecwise linear" 1, 0, 1, 0, 1, 0,... function
% with absolute derivative 2n that goes from 1
% to 0 and back to 1 n times in the interval [0,1]
function y= n_times_cover(n, grid)
x= 0: 1/2/n: 1;
y= [ones(1,floor(n)); zeros(1,floor(n))];
y= y(:);
if n~= floor(n)
    y= [y; 1];
end
y=[0 y.'];
y= interp1(x,y,grid,'linear');
```

```
% the surface is described by z=z(x,y) ;
% x and y are positions on the axis with resolution of 1mm
% x,y,z are generated using the MATLAB instructions shown in Figs. 2D & 2E function flux= produce_surf_flux(x,y,z)

lx=1.73; ly=1.73;            % half of surface length and width
rx= .06; ry=.06;             % half of photovoltaic module length and width angleOfSun= 0.26*pi/180;     % "Half angle" of the sun.
deltax= 1e-3; deltay= 1e-3;  % grid resolution for surface defintion
d=2;                         % receiver distance along z axis from surface origin.
shift=10e-3;                 % leave a small gap between surface Qtrs.

[X,Y]= meshgrid(x,y);

% begin ray tracing simulation
n_rays= 1e6;                 % number of rays in simulation
lf= 450;                     % size of flux matrix flux= zeros(lf+1, lf+1);     % initialize % choose [x,y] points of rays impinging the surface
pts= [lx*rand(1, n_rays)+shift; ly*rand(1, n_rays)+shift];

% model sun as a uniform disc, and choose directions for the points of impingement
phi= sqrt(rand(1, n_rays))*angleOfSun;
theta= rand(1, n_rays)*2*pi;

% calc partial derivatives of surface
dzdy= [z(2,:)- z(1,:); (z(3:end,:)- z(1:end-2,:))/2; z(end,:)- z(end-1,:)]/deltax;
dzdx= [z(:,2)- z(:,1) (z(:,3:end)- z(:,1:end-2))/2 z(:,end)- z(:,end-1)]/deltay;

% interpolate z and derivatives to points of impingement
z_interp= interp2(X,Y,z,pts(1,:),pts(2,:), 'linear');
dzdx_interp= interp2(X,Y,dzdx,pts(1,:),pts(2,:), 'nearest');
dzdy_interp= interp2(X,Y,dzdy,pts(1,:),pts(2,:), 'nearest');
```

TO FIG. 2G

FROM FIG. 2F

```
for k=1:n_rays
    n= [-dzdx_interp(k), -dzdy_interp(k), 1]; % normal to surface
    n= n/norm(n);
    % vector that points to sun along impinging rays
    sun= [sin(phi(k))*cos(theta(k)) sin(phi(k))*sin(theta(k)) cos(phi(k))];
    % find vector u of reflected ray: u+sun= 2<sun,n>n
    u= 2* (sun*n.')*n- sun;
    % find t such that z_interp(k)+ t*u is in the receiver plane: z==d
    t= (d- z_interp(k))/u(3);
    if t<0 keyboard; end
    % find where the reflected ray hits the receiver plane
    hit= [pts(1,k) pts(2,k) z_interp(k)] + t*u;
    hit= round(hit*1000);
    flux(hit(1)+lf/2+1, hit(2)+lf/2+1)= flux(hit(1)+lf/2+1, hit(2)+lf/2+1)+ 1;
end % This is the flux for 1 quarter of the surface. The full surface is obtained by
% symmetry.
flux=flux+flux(end:-1:1,:)+flux(:, end:-1:1)+ flux(end:-1:1,end:-1:1);

% now calculate the fill factor for this flux
function fill_factor=calc_fill_factor(flux)

lx= 1.73; ly= lx;    % half of surface length and width
% sort all flux samples in decreasing order
flx= sort(flux(:));
flx= flx(end:-1:1).';

% use samples as successive thresholds: for each sample - if it is the threshold
% then only samples with a larger flux achieve it.
fill_vec= (flx.*(1:length(flx)))/sum(flx);

% The fill factor is the maximal element of fill_vec
[fill_factor, ind_max]= max(fill_vec);
```

```
clear all
close all deltax= 1e-3; deltay= 1e-3; % [m] grid resolution for surface defintion
lx=1.73; ly=1.73; rx= .06; ry=.06; % [m] half surface and receiver edges.
d=2; %[m] receiver distance along z axis from surface origin.
%  leave a small gap between surface Qtrs.
shiftx= 10e-3; %[m]
shifty= 10e-3; %[m]
% grid for surface definition
x=( 0:deltax:lx)+ shiftx;
y=( 0:deltay:ly)+ shifty;
n_cov= 1; % 1 cover is a scanning of the reciever both ways (back and forth)

% a ray of light hitting the receiver on (x , y ,z) surface
% coordinates should be mapped to (x_star, y_star) -% receiver coordinates
x_star= 2*rx*(n_times_cover(n_cov, (x-shiftx)/lx)-.5);
y_star= 2*ry*(n_times_cover(n_cov, (y-shifty)/ly)-.5);
diff_x= x_star-x;
diff_y= y_star-y;
nx= length(x);
ny= length(y);
% surface z(x,y) and its numerical derivatives.
z= zeros(nx, ny);
dzdx= zeros(nx, ny);
dzdy= zeros(nx, ny);

% definition on edge z(:,1)
for k=1:nx
    denom= d-z(k,1) +norm([diff_x(k) diff_y(1) (d-z(k,1))]);
    dzdx(k, 1)= -diff_x(k)/denom; % partial derivative formula
    dzdy(k, 1)= -diff_y(1)/denom;% partial derivative formula
    if k~= nx
        z(k+1,1)= z(k,1)+ dzdx(k, 1)*deltax;
        % use x partial derivative to extend definition to next grid point
    end
end
clear('k')
```

TO FIG. 3G

FROM FIG. 3F

```
% definition on edge z(1, :)
for k=1:ny
    denom= d-z(1,k) +norm([diff_x(1) diff_y(k) (d-z(1,k))]);
    dzdx(1, k)= -diff_x(1)/denom;% partial derivative formula
    dzdy(1, k)= -diff_y(k)/denom;% partial derivative formula
    if k~= ny
        z(1, k+1)= z(1, k)+ dzdy(1, k)*deltay;
        % use y partioal derivative to extend definition to next grid point
    end
end
clear('k')

% definition for interior points z(k,j), k,j>1
for kx= 2:nx
    for ky= 2:ny
        aprox_x= z(kx-1, ky)+ dzdx(kx-1, ky)* deltax;
        % use x partial derivative to extend definition to next grid point
        aprox_y= z(kx, ky-1)+ dzdy(kx, ky-1)* deltay;
        % use y partial derivative  to extend definition to next grid point
        z(kx, ky)= (aprox_x+ aprox_y)/2; % average both approximations
        denom= d-z(kx,ky) +norm([diff_x(kx) diff_y(ky) (d-z(kx,ky))]);
        dzdx(kx, ky)= -diff_x(kx)/denom; %partial derivative formula
        dzdy(kx, ky)= -diff_y(ky)/denom; %partial derivative formula
    end
end
clear('kx', 'ky')
% sample on "grid" the "piecwise linear" 1, 0, 1, 0, 1, 0,... function
% with absolute derivative 2n that goes from 1
% to 0 and back to 1 n times in the interval [0,1]
function y= n_times_cover(n, grid)
x= 0: 1/2/n: 1;
y= [ones(1,floor(n)); zeros(1,floor(n))];
y= y(:);
if n~= floor(n)
    y= [y; 1];
end
y=[0 y.'];
y= interp1(x,y,grid,'linear');
```

```
% the surface is described by z=z(x,y) ;
% x and y are positions on the axis with resolution of 1mm
% x,y,z are generated using the MATLAB instructions shown in Figs. 3F & 3G function flux= produce_surf_flux(x,y,z)

lx=1.73; ly=1.73;              % half of surface length and width
rx= .06; ry=.06;               % half of photovoltaic module length and width angleOfSun= 0.26*pi/180;       % "Half angle" of the sun.
deltax= 1e-3; deltay= 1e-3;    % grid resolution for surface defintion
d=2;                           % receiver distance along z axis from surface origin.
shift=10e-3;                   % leave a small gap between surface Qtrs.

[X,Y]= meshgrid(x,y);

% begin ray tracing simulation
n_rays= 1e6;                   % number of rays in simulation
lf= 450;                       % size of flux matrix flux= zeros(lf+1, lf+1);       % initialize % choose [x,y] points of rays impinging the surface
pts= [lx*rand(1, n_rays)+shift; ly*rand(1, n_rays)+shift];

% model sun as a uniform disc, and choose directions for the points of impingement
phi= sqrt(rand(1, n_rays))*angleOfSun;
theta= rand(1, n_rays)*2*pi;

% calc partial derivatives of surface
dzdy= [z(2,:)- z(1,:); (z(3:end,:)- z(1:end-2,:))/2; z(end,:)- z(end-1,:)]/deltax;
dzdx= [z(:,2)- z(:,1) (z(:,3:end)- z(:,1:end-2))/2 z(:,end)- z(:,end-1)]/deltay;

% interpolate z and derivatives to points of impingement
z_interp= interp2(X,Y,z,pts(1,:),pts(2,:), 'linear');
dzdx_interp= interp2(X,Y,dzdx,pts(1,:),pts(2,:), 'nearest');
dzdy_interp= interp2(X,Y,dzdy,pts(1,:),pts(2,:), 'nearest');
```

TO FIG. 3I

FROM FIG. 3H

```
for k=1:n_rays
    n= [-dzdx_interp(k), -dzdy_interp(k), 1]; % normal to surface
    n= n/norm(n);
    % vector that points to sun along impinging rays
    sun= [sin(phi(k))*cos(theta(k)) sin(phi(k))*sin(theta(k)) cos(phi(k))];
    % find vector u of reflected ray: u+sun= 2<sun,n>n
    u= 2* (sun*n.')*n- sun;
    % find t such that z_interp(k)+ t*u is in the receiver plane: z==d
    t= (d- z_interp(k))/u(3);
    if t<0 keyboard; end
    % find where the reflected ray hits the receiver plane
    hit= [pts(1,k) pts(2,k) z_interp(k)] + t*u;
    hit= round(hit*1000);
    flux(hit(1)+lf/2+1, hit(2)+lf/2+1)= flux(hit(1)+lf/2+1, hit(2)+lf/2+1)+ 1;
end % This is the flux for 1 quarter of the surface. The full surface is obtained by
% symmetry.
flux=flux+flux(end:-1:1,:)+flux(:, end:-1:1)+ flux(end:-1:1,end:-1:1);

% now calculate the fill factor for this flux
function fill_factor=calc_fill_factor(flux)

lx= 1.73; ly= lx;   % half of surface length and width
% sort all flux samples in decreasing order
flx= sort(flux(:));
flx= flx(end:-1:1).';

% use samples as successive thresholds: for each sample - if it is the threshold
% then only samples with a larger flux achieve it.
fill_vec= (flx.*(1:length(flx)))/sum(flx);

% The fill factor is the maximal element of fill_vec
[fill_factor, ind_max]= max(fill_vec);
```

```
clear all
close all deltax= 1e-3; deltay= 1e-3; % [m] grid resolution for surface defintion
lx=1.73; ly=1.73; rx= .06; ry=.06; % [m] half surface and receiver edges.
d=2; %[m] receiver distance along z axis from surface origin.

% leave a small gap between surface Qtrs.
shiftx= 10e-3; %[m]
shifty= 10e-3; %[m]
% grid for surface definition
x=( 0:deltax:lx)+ shiftx;
y=( 0:deltay:ly)+ shifty;
n_cov= 4.5; % 1 cover is a scanning of the reciever both ways (back and forth)
% a ray of light hitting the receiver on (x , y ,z) surface
%coordinates should be mapped to (x_star, y_star) -% receiver coordinates
x_star= 2*rx*(my_n_times_cover(n_cov, (x-shiftx)/lx)-.5);
y_star= 2*ry*(my_n_times_cover(n_cov, (y-shifty)/ly)-.5);
diff_x= x_star-x;
diff_y= y_star-y;

nx= length(x);
ny= length(y);

% surface z(x,y) and its numerical derivatives.
z= zeros(nx, ny);
dzdx= zeros(nx, ny);
dzdy= zeros(nx, ny);
% definition on edge z(:,1)
for k=1:nx
    denom= d-z(k,1) +norm([diff_x(k) diff_y(1) (d-z(k,1))]);
    dzdx(k, 1)= -diff_x(k)/denom; % partial derivative formula
    dzdy(k, 1)= -diff_y(1)/denom;% partial derivative formula
    if k~= nx
        z(k+1,1)= z(k,1)+ dzdx(k, 1)*deltax;
        % use x partial derivative to extend definition to next grid point
    end
end
```

TO FIG. 4D

FROM FIG. 4C

```
clear('k')

% definition on edge z(1, :)
for k=1:ny
    denom= d-z(1,k) +norm([diff_x(1) diff_y(k) (d-z(1,k))]);
    dzdx(1, k)= -diff_x(1)/denom;% partial derivative formula
    dzdy(1, k)= -diff_y(k)/denom;% partial derivative formula
    if k~= ny
        z(1, k+1)= z(1, k)+ dzdy(1, k)*deltay;
        % use y partioal derivative to extend definition to next grid point
    end
end
clear('k')

% definition for interior points z(k,j), k,j>1
for kx= 2:nx
    for ky= 2:ny
        aprox_x= z(kx-1, ky)+ dzdx(kx-1, ky)* deltax;
        % use x partial derivative to extend definition to next grid point
        aprox_y= z(kx, ky-1)+ dzdy(kx, ky-1)* deltay;
        % use y partial derivative  to extend definition to next grid point
        z(kx, ky)= (aprox_x+ aprox_y)/2; % average both approximations
        denom= d-z(kx,ky) +norm([diff_x(kx) diff_y(ky) (d-z(kx,ky))]);
        dzdx(kx, ky)= -diff_x(kx)/denom; %partial derivative formula
        dzdy(kx, ky)= -diff_y(ky)/denom; %partial derivative formula
    end
end
clear('kx', 'ky')

% sample on "grid" the "piecwise linear" 1, 0, 1, 0, 1, 0,... function
% with absolute derivative 2n that goes from 1
% to 0 and back to 1 n times in the interval [0,1]
function y= n_times_cover(n, grid)
x= 0: 1/2/n: 1;
y= [ones(1,floor(n)); zeros(1,floor(n))];
y= y(:);
if n~= floor(n)
    y= [y; 1];
end
y=[0 y.'];
y= interp1(x,y,grid,'linear');
```

```
% the surface is described by z=z(x,y) ;
% x and y are positions on the axis with resolution of 1mm
% x,y,z are generated using the MATLAB instructions shown in Figs. 4C & 4D function flux= produce_surf_flux(x,y,z)

lx=1.73; ly=1.73;           % half of surface length and width
rx= .06; ry=.06;            % half of photovoltaic module length and width angleOfSun= 0.26*pi/180;    % "Half angle" of the sun.
deltax= 1e-3; deltay= 1e-3; % grid resolution for surface defintion
d=2;                        % receiver distance along z axis from surface origin.
shift=10e-3;                % leave a small gap between surface Qtrs.

[X,Y]= meshgrid(x,y);

% begin ray tracing simulation
n_rays= 1e6;                % number of rays in simulation
lf= 450;                    % size of flux matrix flux= zeros(lf+1, lf+1);    % initialize % choose [x,y] points of rays impinging the surface
pts= [lx*rand(1, n_rays)+shift; ly*rand(1, n_rays)+shift];

% model sun as a uniform disc, and choose directions for the points of impingement
phi= sqrt(rand(1, n_rays))*angleOfSun;
theta= rand(1, n_rays)*2*pi;

% calc partial derivatives of surface
dzdy= [z(2,:)- z(1,:); (z(3:end,:)- z(1:end-2,:))/2; z(end,:)- z(end-1,:)]/deltax;
dzdx= [z(:,2)- z(:,1) (z(:,3:end)- z(:,1:end-2))/2 z(:,end)- z(:,end-1)]/deltay;

% interpolate z and derivatives to points of impingement
z_interp= interp2(X,Y,z,pts(1,:),pts(2,:), 'linear');
dzdx_interp= interp2(X,Y,dzdx,pts(1,:),pts(2,:), 'nearest');
dzdy_interp= interp2(X,Y,dzdy,pts(1,:),pts(2,:), 'nearest');
```

TO FIG. 4F

FROM FIG. 4E

```
for k=1:n_rays
    n= [-dzdx_interp(k), -dzdy_interp(k), 1]; % normal to surface
    n= n/norm(n);
    % vector that points to sun along impinging rays
    sun= [sin(phi(k))*cos(theta(k)) sin(phi(k))*sin(theta(k)) cos(phi(k))];
    % find vector u of reflected ray: u+sun= 2<sun,n>n
    u= 2* (sun*n.')*n- sun;
    % find t such that z_interp(k)+ t*u is in the receiver plane: z==d
    t= (d- z_interp(k))/u(3);
    if t<0 keyboard; end
    % find where the reflected ray hits the receiver plane
    hit= [pts(1,k) pts(2,k) z_interp(k)] + t*u;
    hit= round(hit*1000);
    flux(hit(1)+lf/2+1, hit(2)+lf/2+1)= flux(hit(1)+lf/2+1, hit(2)+lf/2+1)+ 1;
end % This is the flux for 1 quarter of the surface. The full surface is obtained by
% symmetry.
flux=flux+flux(end:-1:1,:)+flux(:, end:-1:1)+ flux(end:-1:1,end:-1:1);

% now calculate the fill factor for this flux
function fill_factor=calc_fill_factor(flux)

lx= 1.73; ly= lx;    % half of surface length and width
% sort all flux samples in decreasing order
flx= sort(flux(:));
flx= flx(end:-1:1).';

% use samples as successive thresholds: for each sample - if it is the threshold
% then only samples with a larger flux achieve it.
fill_vec= (flx.*(1:length(flx)))/sum(flx);

% The fill factor is the maximal element of fill_vec
[fill_factor, ind_max]= max(fill_vec);
```

FIG. 4F

SOLAR ELECTRICITY GENERATION SYSTEM

REFERENCE TO RELATED APPLICATIONS

Reference is made to the following patents and patent applications, owned by assignee, the disclosures of which are hereby incorporated by reference:

U.S. Published Patent Application No. 2009/0065045; and

U.S. patent application Ser. No. 12/677,208, filed Sep. 10, 2008 and entitled "SOLAR ELECTRICITY GENERATION SYSTEM".

FIELD OF THE INVENTION

The present invention relates to photovoltaic power generation.

BACKGROUND OF THE INVENTION

The following publications are believed to represent the current state of the art:
U.S. Pat. Nos. 4,195,913 and 5,153,780;
U.S. Published Patent Application No.: 2009/0065045;
U.S. patent application Ser. No. 12/677,208;

Concentrators employing spherical concave reflective elements suitable for photovoltaic power generation are discussed by Authier, B. and Hill, L., 1980, "High Concentration Solar Collector of the Stepped Spherical Type: Optical Design Characteristics," Applied Optics, Vol 19, No. 20, pp. 3554-3561;

Concentrators designed for photovoltaic applications are discussed by Kurzweg, U. H., 1980, "Characteristics of Axicon Concentrators for Use in Photovoltaic Energy Conversion", Solar Energy, Vol. 24, pp. 411-412;

Swanson, R. M., July 1988, "Photovoltaic Dish Solar-Electric Generator", Proceedings of the Joint Crystalline Cell Research, and Concentrating Collector Projects Review SAND88-0522, Sandia National Laboratories, Albuquerque, N. Mex., pp. 109-119 discuss a parabolic dish in conjugation with a diffuser.

SUMMARY OF THE INVENTION

The present invention seeks to provide improved systems for photovoltaic power generation.

There is thus provided in accordance with a preferred embodiment of the present invention a solar electricity generator including an array of photovoltaic power generating elements, and a single continuous smooth solar reflecting surface, the surface being arranged to reflect light from the sun onto the array of photovoltaic power generating elements, wherein the flux per area at a point of minimum flux per area on the array is approximately 75% of the flux per area at a point of maximum flux per area, the intercept factor of the array is at least 70%, and the optical fill factor of the array is at least 60%.

In accordance with a preferred embodiment of the present invention, the solar electricity generator also includes a solar tracking system, the solar tracking system being operative to rotate and position the reflecting surface opposite the sun throughout the day. Preferably, the solar electricity generator provides a solar radiation concentration ratio of 500-1000. Additionally, the solar reflecting surface includes a vertex located at the center of the reflecting surface, and the reflecting surface is arranged generally perpendicularly to an axis defined by the vertex and the center of the array.

Preferably, the array is arranged in a plane which is perpendicular to the axis and is located opposite the solar reflecting surface. Additionally, an imaginary plane is defined as perpendicularly intersecting the axis at the vertex, and is tangent to the solar reflecting surface.

In accordance with a preferred embodiment of the present invention, a unique 1:1 mapping of solar rays exists between the reflecting surface and the array. Additionally, the shape of the reflecting surface is described by a mathematical function $z=f(x,y)$ wherein z is the distance between a set of coordinates x,y on the imaginary plane and the reflecting surface, x and y are the respective latitudinal and longitudinal distances from coordinates x,y to the vertex on the imaginary plane, and $f(x,y)$ is obtained numerically via the differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

wherein:

$$g(x) = \frac{R_x}{L_x} x \text{ for } x \in \left[-\frac{L_x}{2}, \frac{L_x}{2}\right];$$

$$h(y) = \frac{R_y}{L_y} y \text{ for } y \in \left[-\frac{L_y}{2}, \frac{L_y}{2}\right];$$

d is the distance between the vertex and the intersection of the axis with the array;
$R_x$ is the latitudinal length of the array with an addition of a 2 cm margin;
$R_y$ is the longitudinal length of the array with an addition of a 2 cm margin;
$L_x$ is the projected latitudinal length of the reflecting surface on the imaginary plane; and
$L_y$ is the projected longitudinal length of the reflecting surface on the imaginary plane.

There is also provided in accordance with another preferred embodiment of the present invention a solar electricity generator including an array of photovoltaic power generating elements, and a solar reflecting surface formed as a plurality of continuous smooth solar reflecting surface segments, each of the surface segments being arranged to reflect mutually overlapping fluxes of solar radiation from the sun onto the array of photovoltaic power generating elements.

In accordance with a preferred embodiment of the present invention, the solar reflecting surface is formed as four continuous smooth solar reflecting surface segments, and wherein the flux per area at a point of minimum flux per area on the array is approximately 90% of the flux per area at a point of maximum flux per area, the intercept factor of the array is at least 75%, and the optical fill factor of the array is at least 70%.

Preferably, the solar electricity generator also includes a solar tracking system, the solar tracking system being operative to rotate and position the reflecting surface opposite the sun throughout the day. Preferably, the solar electricity generator is provides a solar radiation concentration ratio of 500-1000.

In accordance with a preferred embodiment of the present invention, the solar reflecting surface includes a vertex located at the center of the reflecting surface, and the reflecting surface is arranged generally perpendicularly to an axis defined by the vertex and the center of the array. Additionally, the array is arranged in a plane which is perpendicular to the axis and is located opposite the solar reflecting surface. Additionally, an imaginary plane is defined as perpendicularly intersecting the axis at the vertex, and is tangent to the solar reflecting surface.

Preferably, the solar reflecting surface segments are symmetric. Preferably, the solar reflecting surface segments are symmetrically arranged about the axis.

In accordance with a preferred embodiment of the present invention, a unique 4:1 mapping of solar rays exists between the four continuous smooth solar reflecting surface segments and the array. Additionally, the shape of the reflecting surface is described by a mathematical function $z=f(x,y)$ wherein z is the distance between a set of coordinates x,y on the imaginary plane and the reflecting surface, x and y are the respective latitudinal and longitudinal distances from coordinates x,y to the vertex on the imaginary plane, and $f(x,y)$ is obtained numerically via the differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

wherein:

$$g(x) = \begin{cases} R_x\left(\frac{2x}{L_x} - \frac{1}{2}\right) & \text{for } x \in (0, L_x/2] \\ R_x\left(\frac{2x}{L_x} + \frac{1}{2}\right) & \text{for } x \in [-L_x/2, 0) \end{cases};$$

$$h(y) = \begin{cases} R_y\left(\frac{2y}{L_y} - \frac{1}{2}\right) & \text{for } y \in (0, L_y/2] \\ R_y\left(\frac{2y}{L_y} + \frac{1}{2}\right) & \text{for } y \in [-L_y/2, 0) \end{cases};$$

d is the distance between the vertex and the intersection of the axis with the array;

$R_x$ is the latitudinal length of the array with an addition of a 2 cm margin;

$R_y$ is the longitudinal length of the array with an addition of a 2 cm margin;

$L_x$ is the projected latitudinal length of the reflecting surface on the imaginary plane; and $L_y$ is the projected longitudinal length of the reflecting surface on the imaginary plane.

There is further provided in accordance with yet another preferred embodiment of the present invention a solar electricity generator including an array of photovoltaic power generating elements, and a solar reflecting surface formed as a plurality of solar reflecting surface segments arranged symmetrically about the center of the reflecting surface, each of the surface segments being divided into a plurality of continuous smooth solar reflecting surface sub segments, each of the surface sub segments being arranged to reflect mutually overlapping fluxes of solar radiation from the sun onto the array of photovoltaic power generating elements.

In accordance with a preferred embodiment of the present invention, the solar reflecting surface is formed as four solar reflecting surface segments, each of the surface segments being divided into four continuous smooth solar reflecting surface sub segments, and wherein the flux per area at a point of minimum flux per area on the array is approximately 60% of the flux per area at a point of maximum flux per area, the intercept factor of the array is at least 80%, and the optical fill factor of the array is at least 60%. Additionally, a generally unique 16:1 mapping of solar rays exists between the reflecting surface sub segments and the array.

In accordance with a preferred embodiment of the present invention, the solar reflecting surface is formed as four solar reflecting surface segments, each of the surface segments being divided into eighty one continuous smooth solar reflecting surface sub segments, and wherein the flux per area at a point of minimum flux per area on the array is approximately 60% of the flux per area at a point of maximum flux per area, the intercept factor of the array is at least 80%, and the optical fill factor of the array is at least 60%. Additionally, a generally unique 81:1 mapping of solar rays exists between the reflecting surface sub segments and the array.

Preferably, the solar electricity generator also includes a solar tracking system, the solar tracking system being operative to rotate and position the reflecting surface opposite the sun throughout the day. Preferably, the solar electricity generator provides a solar radiation concentration ratio of 500-1000.

In accordance with a preferred embodiment of the present invention, the solar reflecting surface includes a vertex located at the center of the reflecting surface, and the reflecting surface is arranged generally perpendicularly to an axis defined by the vertex and the center of the array. Additionally, the array is arranged in a plane which is perpendicular to the axis and is located opposite the solar reflecting surface. Additionally, an imaginary plane is defined as perpendicularly intersecting the axis at the vertex, and is tangent to the solar reflecting surface. Preferably, the solar reflecting surface segments are symmetric.

In accordance with a preferred embodiment of the present invention, for a matrix of n by m surface sub segments of a surface segment, wherein the coordinates of an individual surface sub segment are denoted as k,j, where k is the order of the individual surface sub segment between 1 and n and j is the order of the individual surface sub segment between 1 and m, the shape of the individual surface sub segment at coordinates k,j is described by a mathematical function $z=f(x,y)$ wherein z is the distance between a set of coordinates x,y on the imaginary plane and the reflecting surface, x and y are the respective latitudinal and longitudinal distances from coordinates x,y to the vertex on the imaginary plane, and $f(x,y)$ is obtained numerically via the differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

wherein:

$g(x) =$ $$\begin{cases} (-1)^k R_x\left(k - \frac{1}{2} - \frac{2nx}{L_x}\right) & \text{for } x \in \left[\frac{(k-1)L}{2n}, \frac{kL_x}{2n}\right], k = 1, 2, \ldots n \\ (-1)^k R_x\left(\frac{1}{2} - k - \frac{2nx}{L_x}\right) & \text{for } x \in \left[-\frac{kL_x}{2n}, -\frac{(k-1)L_x}{2n}\right), k = 1, 2, \ldots n \end{cases};$$

-continued $$h(y) = \begin{cases} (-1)^j R_y \left( j - \frac{1}{2} - \frac{2my}{L_y} \right) \text{ for } y \in \left[ \frac{(j-1)L_y}{2m}, \frac{jL_y}{2m} \right], j = 1, 2, \ldots m \\ (-1)^j R_y \left( \frac{1}{2} - j - \frac{2my}{L_y} \right) \text{ for } y \in \left[ -\frac{jL_y}{2m}, -\frac{(j-1)L_y}{2m} \right), \\ \phantom{(-1)^j R_y \left( \frac{1}{2} - j - \frac{2my}{L_y} \right) \text{ for } y \in} j = 1, 2, \ldots m \end{cases} ;$$

d is the distance between the vertex and the intersection of the axis with the array;

$R_x$ is the latitudinal length of the array with an addition of a 2 cm margin;

$R_y$ is the longitudinal length of the array with an addition of a 2 cm margin;

$L_x$ is the projected latitudinal length of the reflecting surface on the imaginary plane; and $L_y$ is the projected longitudinal length of the reflecting surface on the imaginary plane.

BRIEF DESCRIPTION OF THE DRAWINGS

The present invention will be understood and appreciated more fully from the following detailed description, taken in conjunction with the drawings in which:

FIG. 1A is a simplified pictorial illustration of a photovoltaic solar generator constructed and operative in accordance with a preferred embodiment of the invention;

FIG. 1B is a simplified pictorial illustration of a smooth generally concave reflecting surface which is part of the photovoltaic solar generator of FIG. 1A;

FIG. 1C is a simplified sectional illustration of the smooth generally concave reflecting surface of FIG. 1B;

FIGS. 1D and 1E are together an example of a sequence of MATLAB® instructions operative to calculate part of the shape of the reflecting surface of the generator of FIGS. 1A-1C;

FIGS. 1F & 1G are together an example of MATLAB® instructions operative to calculate the optical fill factor of the reflecting surface of the generator of FIGS. 1A-1E;

FIGS. 2D and 2E are together an example of a sequence of MATLAB® instructions operative to calculate part of the shape of the reflecting surface of the generator of FIGS. 2A-2C;

FIGS. 2F & 2G are together an example of MATLAB® instructions operative to calculate the optical fill factor of the reflecting surface of the generator of FIGS. 2A-2E;

FIGS. 3F and 3G are together an example of a sequence of MATLAB® instructions operative to calculate part of the shape of the reflecting surface of the generator of FIGS. 3A-3E;

FIGS. 3H & 3I are together an example of MATLAB® instructions operative to calculate the optical fill factor of the reflecting surface of the generator of FIGS. 3A-3G;

FIGS. 4C and 4D are together an example of a sequence of MATLAB® instructions operative to calculate part of the shape of the reflecting surface of the generator of FIGS. 4A and 4B;

FIGS. 4E & 4F are together an example of MATLAB® instructions operative to calculate the optical fill factor of the reflecting surface of the generator of FIGS. 4A-4D.

DETAILED DESCRIPTION OF PREFERRED EMBODIMENTS

Figure 1H:
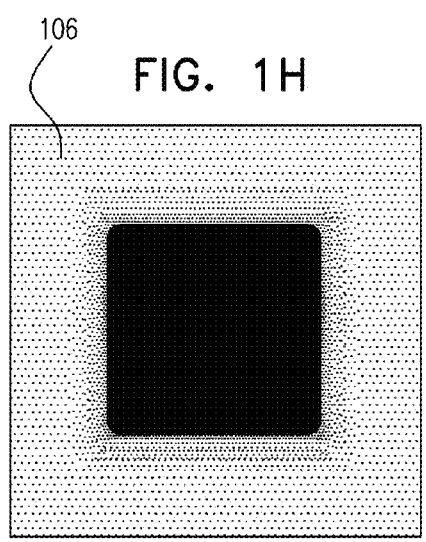
FIG. 1H is a simplified pictorial illustration of a reflected radiation flux distribution pattern produced by the photovoltaic solar generator of FIGS. 1A-1G.

Reference is now made to FIG. 1A, which is a simplified pictorial illustration of a photovoltaic solar generator constructed and operative in accordance with a preferred embodiment of the invention, and to FIGS. 1B and 1C, which are simplified respective pictorial and sectional illustrations of a smooth generally concave reflecting surface which is part of the photovoltaic solar generator of FIG. 1A.

As known to persons skilled in the art, the overall electric current produced by an array of photovoltaic cells connected in series is limited by the photovoltaic cell which generates the weakest current. Therefore, it is desirable that all cells generate a generally equal electric current. It is appreciated that the current generated by an individual photovoltaic cell is generally proportional to the amount of absorbed solar radiation, hence it is desirable that all cells in the array absorb a generally equal amount of solar radiation.

As is also known to persons skilled in the art, a non-uniform flux of incident radiation on an individual photovoltaic cell causes a reduction in the power generating efficiency of the photovoltaic cell. Thus, it is desirable to achieve a uniform flux of radiation over each of the individual photovoltaic cells as well as over the entire array.

As seen in FIG. 1A, there is provided a photovoltaic solar generator 100 having a single continuous smooth generally concave reflecting surface 102 mounted upon a solar tracking system 104 such as a PESOS® SFC 30 Tracking System, commercially available from PAIRAN Elektronik GmbH of Göttingen, Germany. The photovoltaic solar generator 100 also includes a flat photovoltaic module 106 including a multiplicity of photovoltaic cells such as SPECTROLAB CDO-100-C3MJ Concentrator Solar Cells, commercially available from SPECTROLAB Inc. of Sylmar, Calif., located opposite the reflecting surface 102. The reflecting surface 102 reflects a generally uniform flux of solar radiation onto the flat photovoltaic module 106 located opposite the reflecting surface 102, preferably defining a concentration ratio of 500-1000, whereby the optimal distance between the reflecting surface 102 and the photovoltaic module 106 is determined by the shape of the reflecting surface 102, as will be explained hereinbelow.

The uniformity of the flux of radiation impinging on the array of photovoltaic cells can be measured by the optical fill factor of the system. It is therefore an objective of the present invention to achieve a maximum optical fill factor of the system.

Throughout, the term "optical fill factor" of an array of photovoltaic cells is defined to mean the ratio between the amount of radiation that would impinge upon an array had the flux of impinging radiation been uniform at a level matching the level of impinging radiation at the points on the array receiving the lowest level of impinging radiation, and the total amount of radiation actually impinging upon the array. This ratio is shown in FIG. 1A as the ratio between area A and the combination of areas A and B.

In addition to achieving maximum uniformity of the flux of radiation impinging on the array of photovoltaic cells, it is an objective of the present invention to maximize the intercept factor of the system. Throughout, the term "intercept factor" is defined to mean the fraction of radiation reflected by the surface that impinges on the absorbing surface of the receiver.

As also seen in FIG. 1A, a first curved axis 108 of surface 102 perpendicularly intersects a second curved axis 110 of surface 102 at a vertex 116 located at the center of surface 102.

As seen in FIGS. 1B and 1C and as mentioned hereinabove, the reflecting surface 102 reflects a generally uniform flux of solar radiation onto the flat photovoltaic module 106. As also seen in FIG. 1C, the reflecting surface 102 is arranged generally perpendicularly to an axis 118 defined by the vertex 116 and the photovoltaic module 106, whereby the photovoltaic module 106 is symmetrically arranged about axis 118 in a plane perpendicular thereto. The solar tracking system 104 is operative to rotate and position the reflecting surface 102 opposite the sun throughout the day, thereby aligning axis 118 with the sun. A plane 120 is defined as perpendicularly intersecting axis 118 at vertex 116.

It is a particular feature of this embodiment of the present invention that the single continuous smooth generally concave reflecting surface 102 is shaped so that a unique 1:1 mapping of solar rays exists between the reflecting surface 102 and the photovoltaic module 106.

The shape of the reflecting surface 102 can be described by a mathematical function z=f(x,y) where z is the distance between a set of coordinates x,y on plane 120 and the reflecting surface 102, and where coordinates x and y are the distances relative to vertex 116 on a projection of axis 108 and 110 onto plane 120.

Reference is now made to FIGS. 1D and 1E, which are together an example of a sequence of MATLAB® instructions operative to calculate part of the shape of the reflecting surface of the generator of FIGS. 1A-1C, and to FIGS. 1F & 1G, which are together an example of MATLAB® instructions operative to calculate the optical fill factor of the generator of FIGS. 1A-1E.

f(x,y) can be obtained via the following differential equations:

$$\frac{\partial f(x, y)}{\partial x} = \frac{x - g(x)}{d - f(x, y) + \sqrt{(x - g(x))^2 + (y - h(y))^2 + (d - f(x, y))^2}}$$

$$\frac{\partial f(x, y)}{\partial y} = \frac{y - h(y)}{d - f(x, y) + \sqrt{(x - g(x))^2 + (y - h(y))^2 + (d - f(x, y))^2}};$$

where:

$$g(x) = \frac{R_x}{L_x} x \text{ for } x \in \left[-\frac{L_x}{2}, \frac{L_x}{2}\right];$$

$$h(y) = \frac{R_y}{L_y} y \text{ for } y \in \left[-\frac{L_y}{2}, \frac{L_y}{2}\right];$$

d is the distance between the vertex 116 and the intersection of axis 118 with flat photovoltaic module 106;

$R_x$ is the latitudinal length of photovoltaic module 106 with an addition of a 2 cm margin;

$R_y$ is the longitudinal length of photovoltaic module 106 with an addition of a 2 cm margin;

$L_x$ is the projected length of axis 108 onto plane 120; and $L_y$ is the projected length of axis 110 onto plane 120.

Using the sequence of MATLAB® instructions shown in FIGS. 1D and 1E, f(x,y) for one quarter of the reflecting surface 102 can be obtained numerically via the above equations. Due to the symmetry of reflecting surface 102, f(x,y) for the remaining quarters of surface 102 can be extrapolated using the above calculation for a single quarter.

For example, for a single continuous smooth generally concave reflecting surface 102 where $L_x=L_y=3.46$ meters, the distance d is 2 meters and the dimensions of the photovoltaic module 106 are 10×10 centimeters, the value of z is calculated to vary between 0 at vertex 116 and 73.5 centimeters at each of the corners of reflecting surface 102. The total flux of solar radiation impinging upon the photovoltaic module 106 is calculated to be approximately 833 suns, whereby the flux per area at a point on the photovoltaic module 106 of minimum flux per area is approximately 75% of the flux per area at a point on the photovoltaic module 106 of maximum flux per area. The intercept factor of the photovoltaic module 106 is calculated to be no less than 70%, and the optical fill factor is calculated to be no less than 60%.

The optical fill factor is calculated using the sequence of MATLAB® instructions shown in FIGS. 1F & 1G, which utilizes the calculation of f(x,y) shown in FIGS. 1D & 1E.

It is appreciated that although FIGS. 1A-1C illustrate reflecting surface 102 as being a unitary reflecting surface, for considerations relating for example to manufacturing and shipping, alternative embodiments of the present invention may include a plurality of surface segments assembled to form reflecting surface 102.

FIG. 1H is a simplified pictorial illustration of a reflected radiation flux distribution pattern produced by the photovoltaic solar generator of FIGS. 1A-1G on the flat photovoltaic module 106. As seen in FIG. 1H, the reflected radiation flux pattern produced on the flat photovoltaic module 106 is generally uniform in intensity over the entirety of photovoltaic module 106, and tapers off steeply at the edges thereof.

Figure 2A:
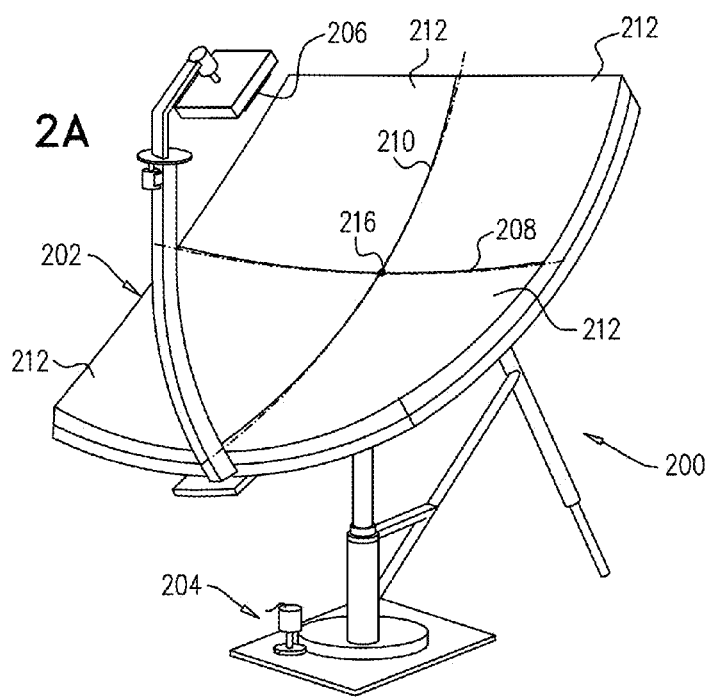
FIG. 2A is a simplified pictorial illustration of a photovoltaic solar generator constructed and operative in accordance with another preferred embodiment of the invention.
Figure 2B:
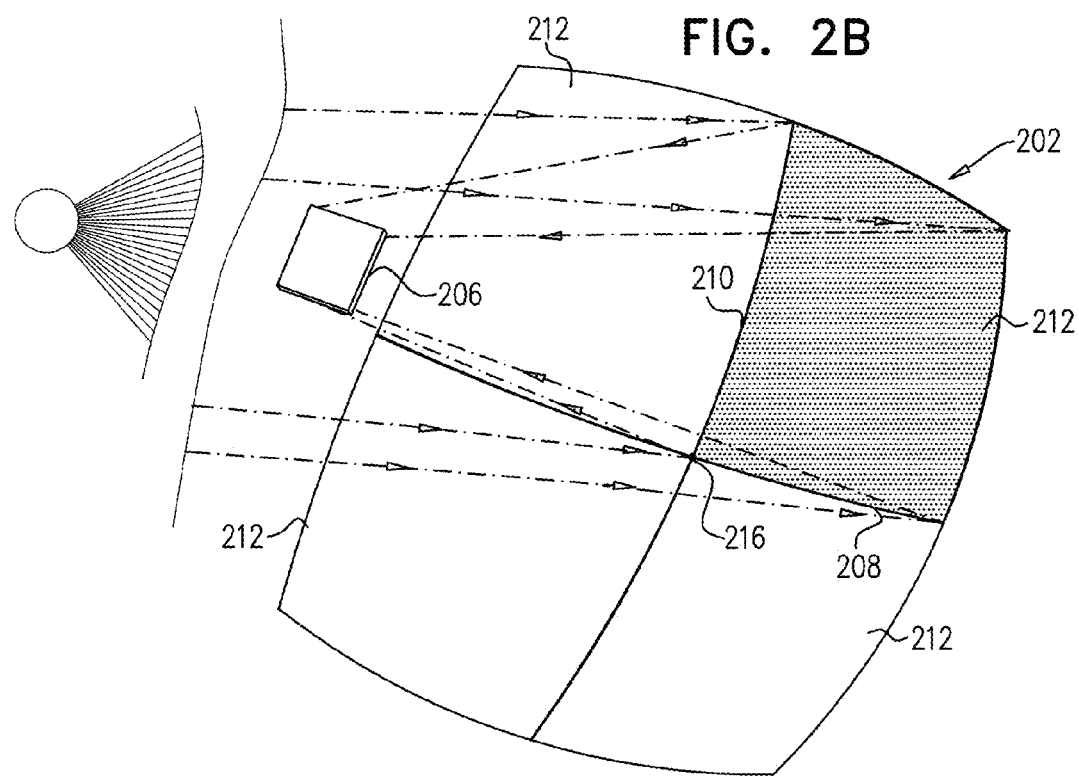
FIG. 2B is a simplified pictorial illustration of a smooth generally concave reflecting surface which is part of the photovoltaic solar generator of FIG. 2A.
Figure 2C:
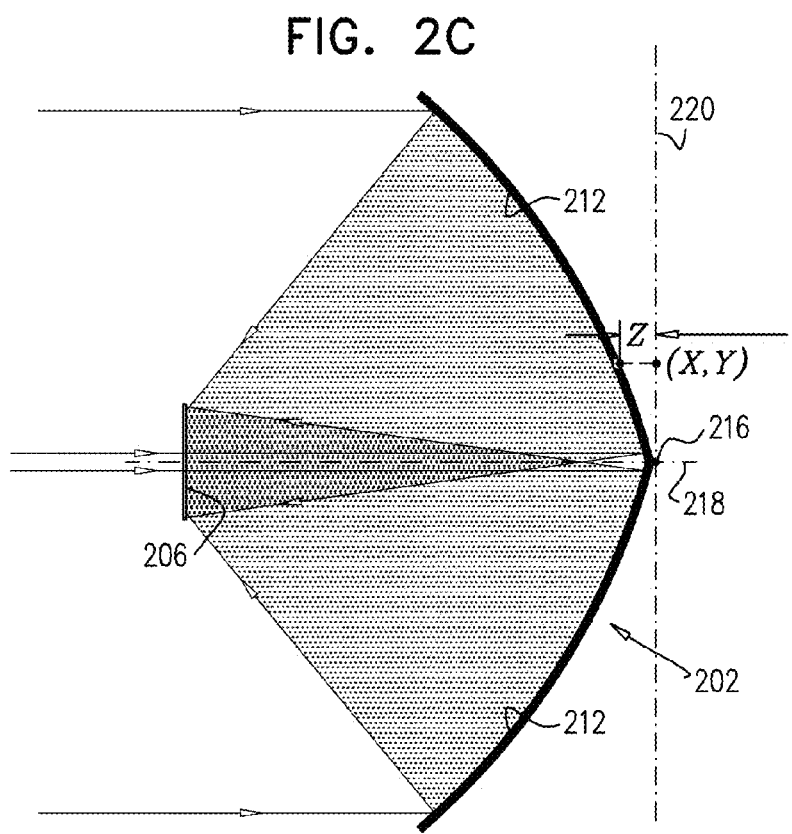
FIG. 2C is a simplified sectional illustration of the smooth generally concave reflecting surface of FIG. 2B.

Reference is now made to FIG. 2A, which is a simplified pictorial illustration of a photovoltaic solar generator constructed and operative in accordance with another preferred embodiment of the invention, and to FIGS. 2B and 2C, which are simplified respective pictorial and sectional illustrations of a smooth generally concave reflecting surface which is part of the photovoltaic solar generator of FIG. 2A.

As seen in FIG. 2A, there is provided a photovoltaic solar generator 200 having a smooth generally concave reflecting surface 202 mounted upon a solar tracking system 204 such as a PESOS® SFC 30 Tracking System, commercially available from PAIRAN Elektronik GmbH of Göttingen, Germany. The photovoltaic solar generator 200 also includes a flat photovoltaic module 206 including a multiplicity of photovoltaic cells such as SPECTROLAB CDO-100-C3MJ Concentrator Solar Cells, commercially available from SPECTROLAB Inc. of Sylmar, Calif., located opposite the reflecting surface 202. The reflecting surface 202 reflects a generally uniform flux of solar radiation onto the flat photovoltaic module 206 located opposite the reflecting surface 202, preferably defining a concentration ratio of 500-1000, whereby the optimal distance between the reflecting surface 202 and the photovoltaic module 206 is determined by the shape of the reflecting surface 202, as will be explained hereinbelow.

As also seen in FIG. 2A, a first curved axis 208 of surface 202 perpendicularly intersects a second curved axis 210 of surface 202. Axis 208 and axis 210 divide the reflecting surface 202 into four planar symmetric and continuous smooth generally concave reflecting surface segments 212. A vertex 216 is defined by the intersection of axis 208 and 210.

As seen in FIGS. 2B and 2C and as mentioned hereinabove, the reflecting surface 202 reflects a generally uniform flux of solar radiation onto the flat photovoltaic module 206. As also seen in FIG. 2C, the reflecting surface 202 is arranged generally perpendicularly to an axis 218 defined by the vertex 216 and the photovoltaic module 206, whereby the photovoltaic module 206 is symmetrically arranged about axis 218 in a plane perpendicular thereto. The solar tracking system 204 is operative to rotate and position the reflecting surface 202 opposite the sun throughout the day, thereby aligning axis 218 with the sun. A plane 220 is defined as perpendicularly intersecting axis 218 at vertex 216.

It is a particular feature of this embodiment of the present invention that the reflecting surface 202 is shaped so that a 4:1 mapping of solar rays exists between the four continuous smooth generally concave reflecting surface segments 212 and the photovoltaic module 206. This arrangement, whereby the photovoltaic module 206 receives four overlapping and generally evenly distributed fluxes of solar radiation, provides for a generally uniform flux of solar radiation on the photovoltaic module 206 even in the case of damage to a limited region of one of the reflecting surface segments 212.

The shape of the reflecting surface 202 can be described by a mathematical function z=f(x,y) where z is the distance between a set of coordinates x,y on plane 220 and the reflecting surface 202, and where coordinates x and y are the distances relative to vertex 216 on a projection of axis 208 and 210 onto plane 220.

Reference is now made to FIGS. 2D and 2E, which are together an example of a sequence of MATLAB® instructions operative to calculate part of the shape of the reflecting surface of the generator of FIGS. 2A-2C, and to FIGS. 2F & 2G, which are together an example of MATLAB® instructions operative to calculate the optical fill factor of the generator of FIGS. 2A-2E.

f(x,y) can be obtained via the following differential equations:

$$\frac{\partial f(x, y)}{\partial x} = \frac{x - g(x)}{d - f(x, y) + \sqrt{(x - g(x))^2 + (y - h(y))^2 + (d - f(x, y))^2}}$$

$$\frac{\partial f(x, y)}{\partial y} = \frac{y - h(y)}{d - f(x, y) + \sqrt{(x - g(x))^2 + (y - h(y))^2 + (d - f(x, y))^2}};$$

where:

$$g(x) = \begin{cases} R_x\left(\frac{2x}{L_x} - \frac{1}{2}\right) & \text{for } x \in (0, L_x/2] \\ R_x\left(\frac{2x}{L_x} + \frac{1}{2}\right) & \text{for } x \in [-L_x/2, 0) \end{cases};$$

$$h(y) = \begin{cases} R_y\left(\frac{2y}{L_y} - \frac{1}{2}\right) & \text{for } y \in (0, L_y/2] \\ R_y\left(\frac{2y}{L_y} + \frac{1}{2}\right) & \text{for } y \in [-L_y/2, 0) \end{cases};$$

d is the distance between vertex 216 and the intersection of axis 218 with flat photovoltaic module 206;

$R_x$ is the latitudinal length of photovoltaic module 206 with an addition of a 2 cm margin;

$R_y$ is the longitudinal length of photovoltaic module 206 with an addition of a 2 cm margin;

$L_x$ is the projected length of axis 208 onto plane 220; and $L_y$ is the projected length of axis 210 onto plane 220.

Using the sequence of MATLAB® instructions shown in FIGS. 2D and 2E, f(x,y) for one quarter of the reflecting surface 202 can be obtained numerically via the above equations. Due to the symmetry of reflecting surface 202, f(x,y) for the remaining quarters of surface 202 can be extrapolated using the above calculation for a single quarter.

For example, for a reflecting surface 202 where $L_x=L_y=3.46$ meters, the distance d is 2 meters and the dimensions of the photovoltaic module 206 are 10×10 centimeters, the value of z is calculated to vary between 0 at vertex 216 and 76.5 centimeters at each of the corners of reflecting surface 202. The total flux of solar radiation impinging upon the photovoltaic module 206 is calculated to be approximately 833 suns, whereby the flux per area at a point on the photovoltaic module 206 of minimum flux per area is approximately 90% of the flux per area at a point on the photovoltaic module 206 of maximum flux per area. The intercept factor of the photovoltaic module 206 is calculated to be no less than 75%, and the optical fill factor is calculated to be no less than 70%.

The optical fill factor is calculated using the sequence of MATLAB® instructions shown in FIGS. 2F & 2G, which utilizes the calculation of f(x,y) shown in FIGS. 2D & 2E.

Figure 2H:
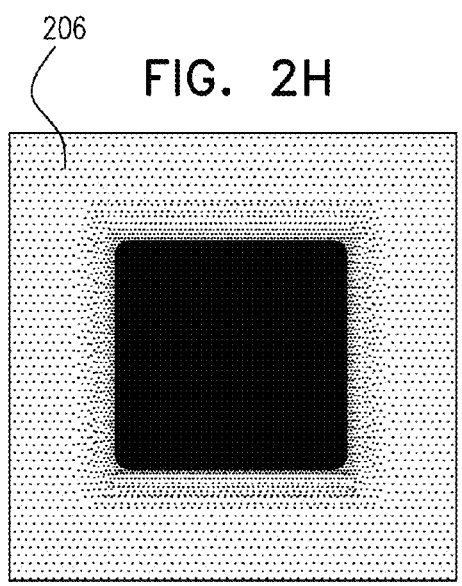
FIG. 2H is a simplified pictorial illustration of a reflected radiation flux distribution pattern produced by the photovoltaic solar generator of FIGS. 2A-2G.

FIG. 2H is a simplified pictorial illustration of a reflected radiation flux distribution pattern produced by the photovoltaic solar generator of FIGS. 2A-2G on the flat photovoltaic module 206. As seen in FIG. 2H, the reflected radiation flux pattern produced on the flat photovoltaic module 206 is generally uniform in intensity over the entirety of photovoltaic module 206, and tapers off steeply at the edges thereof.

Figure 3A:
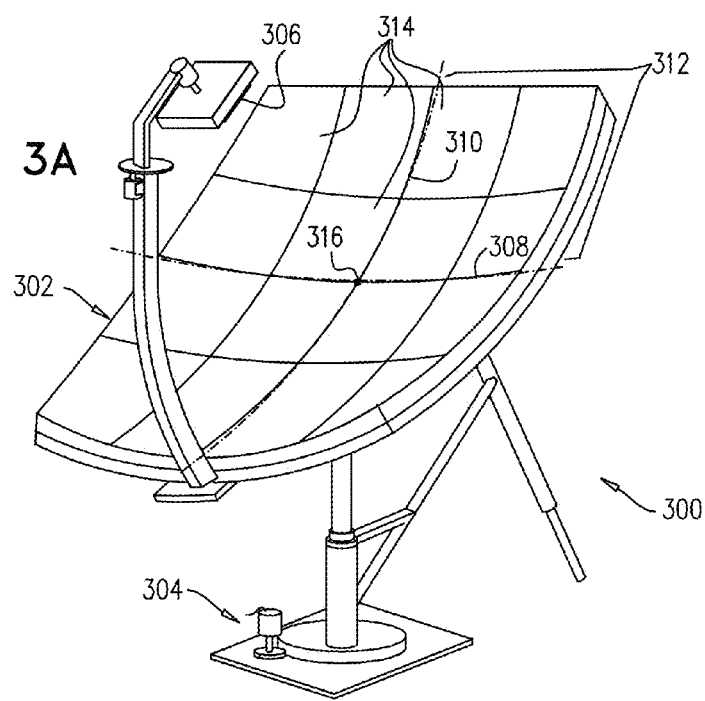
FIG. 3A is a simplified pictorial illustration of a photovoltaic solar generator constructed and operative in accordance with yet another preferred embodiment of the invention.
Figure 3B:
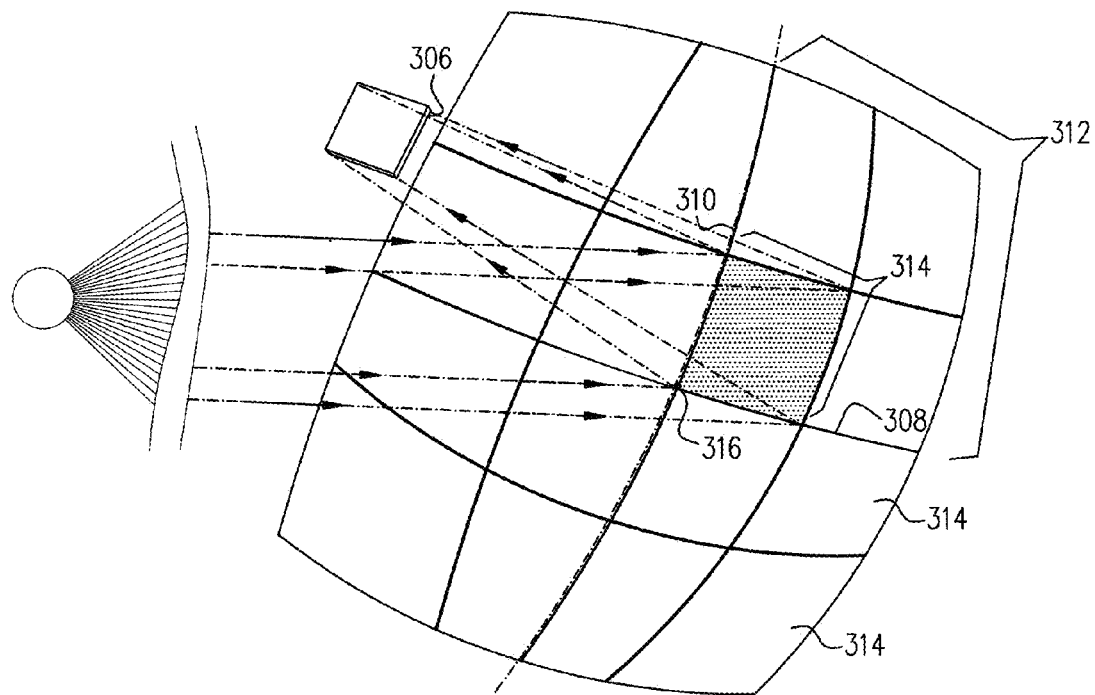
FIG. 3B is a simplified pictorial illustration of a smooth generally concave reflecting surface which is part of the photovoltaic solar generator of FIG. 3A.
Figure 3C:
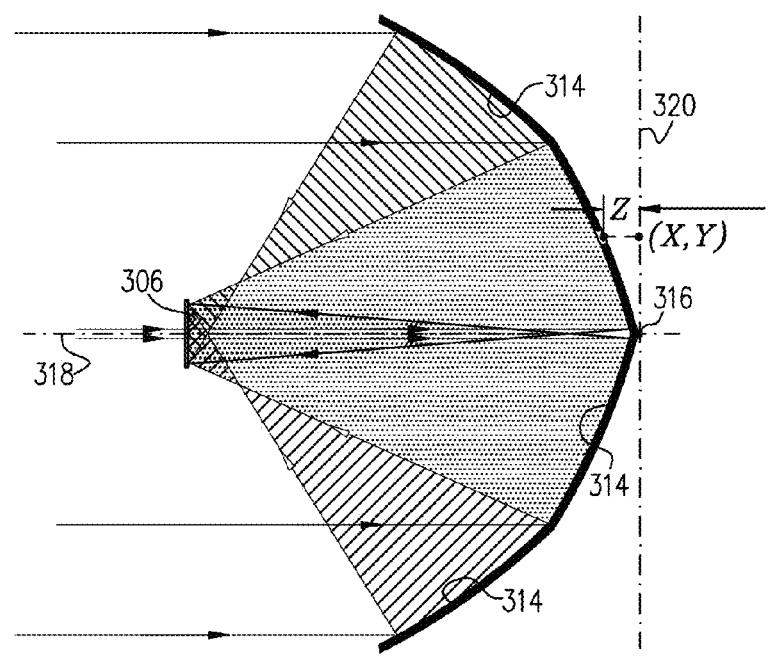
FIG. 3C is a simplified sectional illustration of the smooth generally concave reflecting surface of FIG. 3B.

Reference is now made to FIG. 3A, which is a simplified pictorial illustration of a photovoltaic solar generator constructed and operative in accordance with yet another preferred embodiment of the invention, and to FIGS. 3B and 3C, which are simplified respective pictorial and sectional illustrations of a smooth generally concave reflecting surface which is part of the photovoltaic solar generator of FIG. 3A.

As seen in FIG. 3A, there is provided a photovoltaic solar generator 300 having a smooth generally concave reflecting surface 302 mounted upon a solar tracking system 304 such as a PESOS® SFC 30 Tracking System, commercially available from PAIRAN Elektronik GmbH of Göttingen, Germany. The photovoltaic solar generator 300 also includes a flat photovoltaic module 306 including a multiplicity of photovoltaic cells such as SPECTROLAB CDO-100-C3MJ Concentrator Solar Cells, commercially available from SPECTROLAB Inc. of Sylmar, Calif., located opposite the reflecting surface 302. The reflecting surface 302 reflects a generally uniform flux of solar radiation onto the flat photovoltaic module 306 located opposite the reflecting surface 302, preferably defining a concentration ratio of 500-1000, whereby the optimal distance between the reflecting surface 302 and the photovoltaic module 306 is determined by the shape of the reflecting surface 302, as will be explained hereinbelow.

As also seen in FIG. 3A, a first curved axis 308 of surface 302 perpendicularly intersects a second curved axis 310 of surface 302. Axis 308 and axis 310 divide the reflecting surface 302 into four planar symmetric and generally concave reflecting surface segments 312. Each of the four reflecting surface segments 312 is further divided into four generally equally sized reflecting surface sub segments 314. A vertex 316 is defined by the intersection of axis 308 and 310.

As seen in FIGS. 3B and 3C and as mentioned hereinabove, the reflecting surface 302 reflects a generally uniform flux of solar radiation onto the flat photovoltaic module 306. As also seen in FIG. 3C, the reflecting surface 302 is arranged generally perpendicularly to an axis 318 defined by the vertex 316 and the photovoltaic module 306, whereby the photovoltaic module 306 is symmetrically arranged about axis 318 in a plane perpendicular thereto. The solar tracking system 304 is operative to rotate and position the reflecting surface 302 opposite the sun throughout the day, thereby aligning axis 318 with the sun. A plane 320 is defined as perpendicularly intersecting axis 318 at vertex 316.

It is a particular feature of this embodiment of the present invention that the reflecting surface 302 is shaped so that a 4:1 mapping of solar rays exists between the four reflecting surface sub segments 314 adjacent to vertex 316 and the photovoltaic module 306, whereby each of the four reflecting surface sub segments 314 adjacent to vertex 316 reflects a generally equal amount of solar radiation onto the photovoltaic module 306, thereby producing a generally uniform flux of solar radiation on the photovoltaic module 306. This arrangement, whereby the photovoltaic module 306 receives four overlapping and generally evenly distributed fluxes of solar radiation, provides for a generally uniform flux of solar radiation on the photovoltaic module 306 even in the case of damage to a limited region of one of the four reflecting surface sub segments 314 adjacent to vertex 316.

Figure 3D:
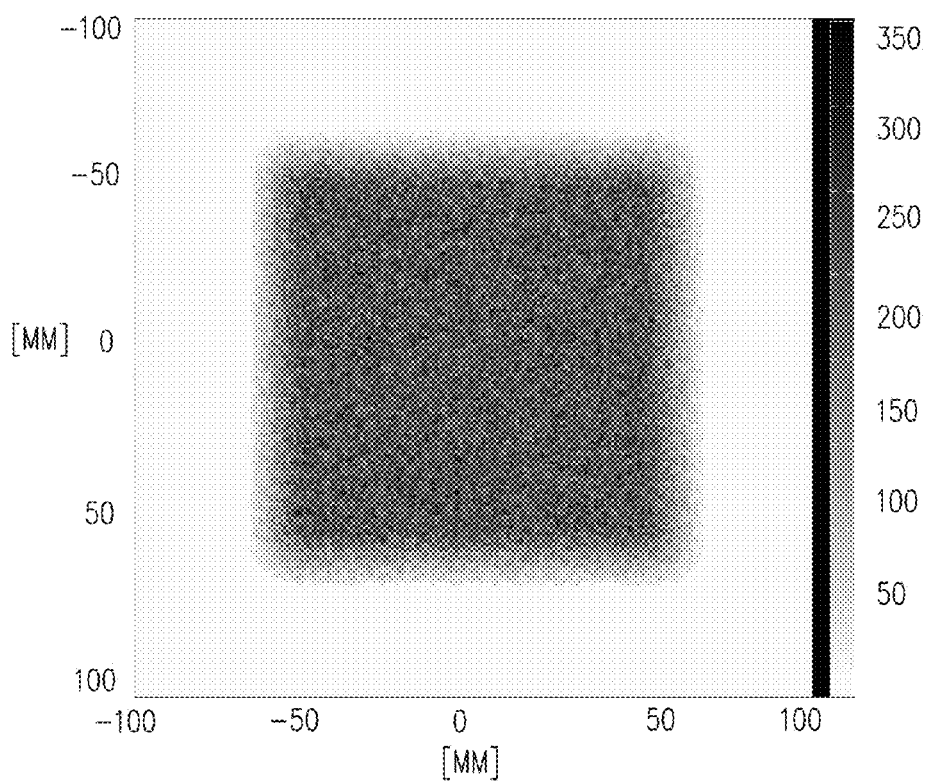
FIG. 3D is a simplified pictorial illustration of a reflected radiation flux distribution pattern produced by a part of the photovoltaic solar generator of FIG. 3A.
Figure 3E:
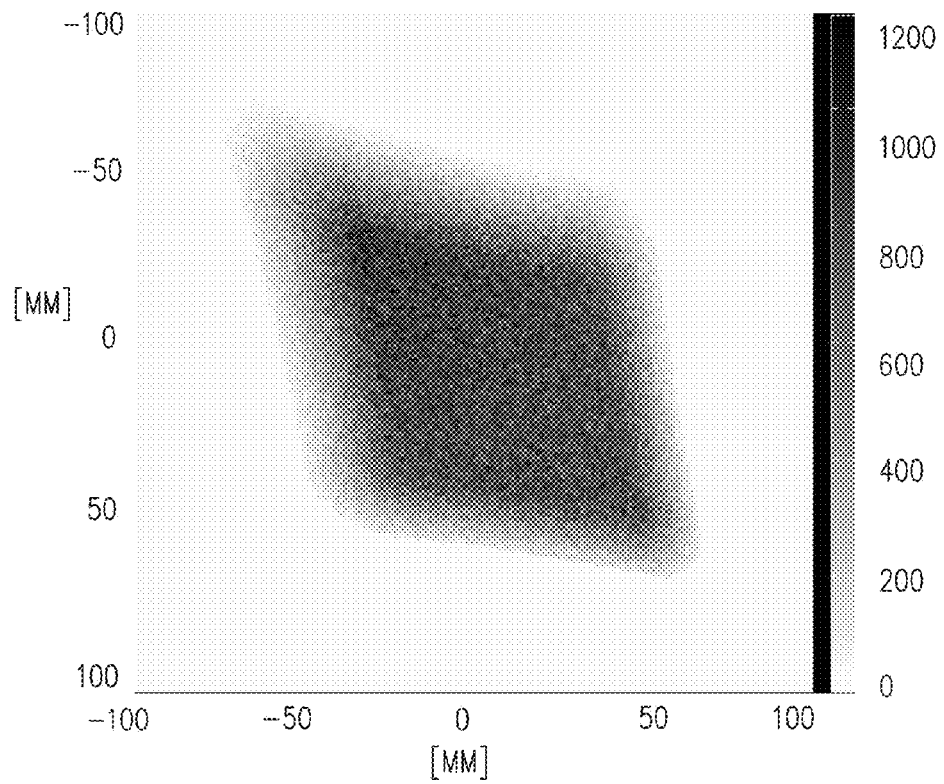
FIG. 3E is a simplified pictorial illustration of a reflected radiation flux distribution pattern produced by another part of the photovoltaic solar generator of FIG. 3A.

Reference is now made to FIG. 3D, which is a simplified pictorial illustration of reflected radiation flux distribution pattern produced by one of the four reflecting surface sub segments 314 adjacent to vertex 316 on the photovoltaic module 306, and is a part of the photovoltaic solar generator of FIG. 3A, and to FIG. 3E which is a simplified pictorial illustration of reflected radiation flux distribution pattern produced by one of the twelve reflecting surface sub segments 314 which are not adjacent to vertex 316 on the photovoltaic module 306, and is a part of the photovoltaic solar generator of FIG. 3A.

In addition to the aforementioned 4:1 mapping between the four reflecting surface sub segments 314 adjacent to vertex 316 and the flat photovoltaic module 306, the shape of reflecting surface 302 also provides for a mapping between each of the twelve reflecting surface sub segments 314 which are not adjacent to vertex 316 and the flat photovoltaic module 306. Each of the twelve reflecting surface sub segments 314 which are not adjacent to vertex 316 reflects a generally equal and overlapping flux of solar radiation onto the flat photovoltaic module 306, thereby producing an additional generally uniform flux of solar radiation on the flat photovoltaic module 306 which is superimposed over the generally uniform flux of solar radiation reflected by the four reflecting surface sub segments 314 adjacent to vertex 316. However, as seen in FIGS. 3D and 3E, the radiation flux distribution pattern produced by one of the twelve reflecting surface sub segments 314 which are not adjacent to vertex 316 is not entirely superimposed over the radiation flux distribution pattern produced by the four reflecting surface sub segments 314 adjacent to vertex 316.

The shape of the reflecting surface 302 can be described by a mathematical function $z = f(x,y)$ where z is the distance between a set of coordinates x,y on plane 320 and the reflecting surface 302, and where coordinates x and y are the distances relative to vertex 316 on a projection of axis 308 and 310 onto plane 320.

Reference is now made to FIGS. 3F and 3G, which are together an example of a sequence of MATLAB® instructions operative to calculate part of the shape of the reflecting surface of the generator of FIGS. 3A-3E, and to FIGS. 3H & 3I, which are together an example of MATLAB® instructions operative to calculate the optical fill factor of the generator of FIGS. 3A-3G.

$f(x,y)$ can be obtained via the following differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

where:

$$g(x) = \begin{cases} R_x\left(\frac{4x}{L_x} - \frac{1}{2}\right) & \text{for } x \in (0, L_x/4] \\ R_x\left(-\frac{4x}{L_x} + \frac{3}{2}\right) & \text{for } x \in [L_x/4, L_x/2] \\ R_x\left(\frac{4x}{L_x} + \frac{1}{2}\right) & \text{for } x \in [-L_x/4, 0) \\ R_x\left(-\frac{4x}{L_x} - \frac{3}{2}\right) & \text{for } x \in [-L_x/2, -L_x/4] \end{cases};$$

-continued $$h(y) = \begin{cases} R_y\left(\dfrac{4y}{L_y} - \dfrac{1}{2}\right) & \text{for } y \in (0, L_y/4] \\ R_y\left(-\dfrac{4y}{L_y} + \dfrac{3}{2}\right) & \text{for } y \in [L_y/4, L_y/2] \\ R_y\left(\dfrac{4y}{L_y} + \dfrac{1}{2}\right) & \text{for } y \in [-L_y/4, 0) \\ R_y\left(-\dfrac{4y}{L_y} - \dfrac{3}{2}\right) & \text{for } y \in [-L_y/2, -L_y/4] \end{cases};$$

d is the distance between vertex 316 and the intersection of axis 318 with flat photovoltaic module 306;

$R_x$ is the latitudinal length of photovoltaic module 306 with an addition of a 2 cm margin;

$R_y$ is the longitudinal length of photovoltaic module 306 with an addition of a 2 cm margin;

$L_x$ is the projected length of axis 308 onto plane 320; and $L_y$ is the projected length of axis 310 onto plane 320.

Using the sequence of MATLAB® instructions shown in FIGS. 3F and 3G, f(x,y) for one quarter of the reflecting surface 302 can be obtained numerically via the above equations. Due to the symmetry of reflecting surface 302, f(x,y) for the remaining quarters of surface 302 can be extrapolated using the above calculation for a single quarter.

For example, for a reflecting surface 302 where $L_x = L_y = 3.46$ meters, the distance d is 2 meters and the dimensions of the photovoltaic module 306 are 10×10 centimeters, the value of z is calculated to vary between 0 at vertex 316 and 75.5 centimeters at each of the corners of reflecting surface 302. The flux of solar radiation impinging upon the photovoltaic module 306 is calculated to be approximately 833 suns, whereby the flux per area at a point on the photovoltaic module 306 of minimum flux per area is approximately 60% of the flux per area at a point on the photovoltaic module 306 of maximum flux per area. The intercept factor of the photovoltaic module 306 is calculated to be no less than 80%, and the optical fill factor is calculated to be no less than 60%.

The optical fill factor is calculated using the sequence of MATLAB® instructions shown in FIGS. 3H & 3I, which utilizes the calculation of f(x,y) shown in FIGS. 3F & 3G.

Figure 3J:
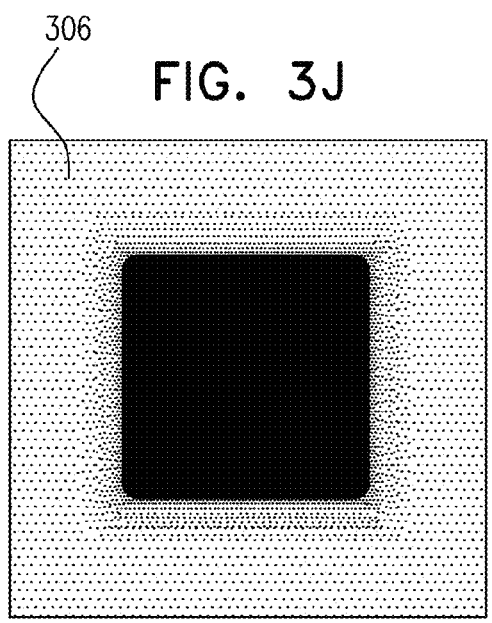
FIG. 3J is a simplified pictorial illustration of a reflected radiation flux distribution pattern produced by the photovoltaic solar generator of FIGS. 3A-3I.

FIG. 3J is a simplified pictorial illustration of a reflected radiation flux distribution pattern produced by the photovoltaic solar generator of FIGS. 3A-3I on the flat photovoltaic module 306. As seen in FIG. 3J, the reflected radiation flux pattern produced on the flat photovoltaic module 306 is generally uniform in intensity over the entirety of photovoltaic module 306, and tapers off steeply at the edges thereof.

It is appreciated that in alternative embodiments of the present invention, reflecting surface segments 312 may be divided into any number of generally equally sized reflecting surface sub segments, creating a matrix of surface sub segments, wherein each of the surface sub segments is larger than the flat photovoltaic module 306, and whereby each of the surface sub segments reflects a generally equal and overlapping generally uniform flux of solar radiation onto the photovoltaic module 306. It is noted that while the surface sub segments adjacent to vertex 316 reflect generally equal and overlapping fluxes of solar radiation onto the entirety of photovoltaic module 306, surface sub segments which are not adjacent to vertex 316 reflect fluxes of solar radiation which are not entirely overlapping and that do not cover the entirety of photovoltaic module 306.

For a matrix of n by m surface sub segments, where n is the number of sub segments from vertex 316 to the edge of the surface segment 312 along axis 308, m is the number of surface sub segments from vertex 316 to the edge of the surface segment 312 along axis 310 and $$\frac{R_x}{(L_x/n)} = \frac{R_y}{(L_y/m)}$$

the coordinates of an individual surface sub segment are denoted as k,j, where k is the order of the individual surface sub segment on axis 308 between 1 and n, and j is the order of the individual surface sub segment on axis 310 between 1 and m.

The shape of the individual surface sub segment at coordinates k,j can be described by a mathematical function $z_{k,j} = f(x,y)$ where $z_{k,j}$ is the distance between a set of coordinates x,y on plane 320 and the reflecting surface 302, and where coordinates x and y are the distances relative to vertex 316 on a projection of axis 308 and 310 onto plane 320.

f(x,y) can be obtained numerically by using the following derivatives:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}}$$

where:

$$g(x) = \begin{cases} (-1)^k R_x\left(k - \dfrac{1}{2} - \dfrac{2nx}{L_x}\right) & \text{for } x \in \left[\dfrac{(k-1)L}{2n}, \dfrac{kL_x}{2n}\right], k = 1, 2, \ldots n \\ (-1)^k R_x\left(\dfrac{1}{2} - k - \dfrac{2nx}{L_x}\right) & \text{for } x \in \left[-\dfrac{kL_x}{2n}, -\dfrac{(k-1)L_x}{2n}\right], k = 1, 2, \ldots n \end{cases};$$

$$h(y) = \begin{cases} (-1)^j R_y\left(j - \dfrac{1}{2} - \dfrac{2my}{L_y}\right) & \text{for } y \in \left[\dfrac{(j-1)L_y}{2m}, \dfrac{jL_y}{2m}\right], j = 1, 2, \ldots m \\ (-1)^j R_y\left(\dfrac{1}{2} - j - \dfrac{2my}{L_y}\right) & \text{for } y \in \left[-\dfrac{jL_y}{2m}, -\dfrac{(j-1)L_y}{2m}\right], \\ & \qquad j = 1, 2, \ldots m \end{cases};$$

d is the distance between vertex 316 and the intersection of axis 318 with flat photovoltaic module 306;

$R_x$ is the latitudinal length of photovoltaic module 306 with an addition of a 2 cm margin;

$R_y$ is the longitudinal length of photovoltaic module 306 with an addition of a 2 cm margin;

$L_x$ is the projected length of axis 308 onto plane 320; and $L_y$ is the projected length of axis 310 onto plane 320.

For example, for an embodiment including a reflecting surface 302 where $L_x = L_y = 3.46$ meters, the distance d is 2 meters, the dimensions of the photovoltaic module 306 are 10×10 centimeters and each of the four reflecting surface segments 312 is further divided into a matrix of 9×9 generally equally sized reflecting surface sub segments, the value of z is calculated to vary between 0 at vertex 316 and 75.6 centimeters at each of the corners of reflecting surface 302. The flux of solar radiation impinging upon the photovoltaic module 306 is calculated to be approximately 833 suns, whereby the flux per area at a point on the photovoltaic module 306 of minimum flux per area is approximately 60% of the flux per area at a point on the photovoltaic module 306 of maximum flux per area. The intercept factor of the photovoltaic module 306 is calculated to be no less than 80%, and the optical fill factor is calculated to be no less than 60%. This embodiment is further described hereinbelow in conjunction with FIGS. 4A-4C.

Figure 4A:
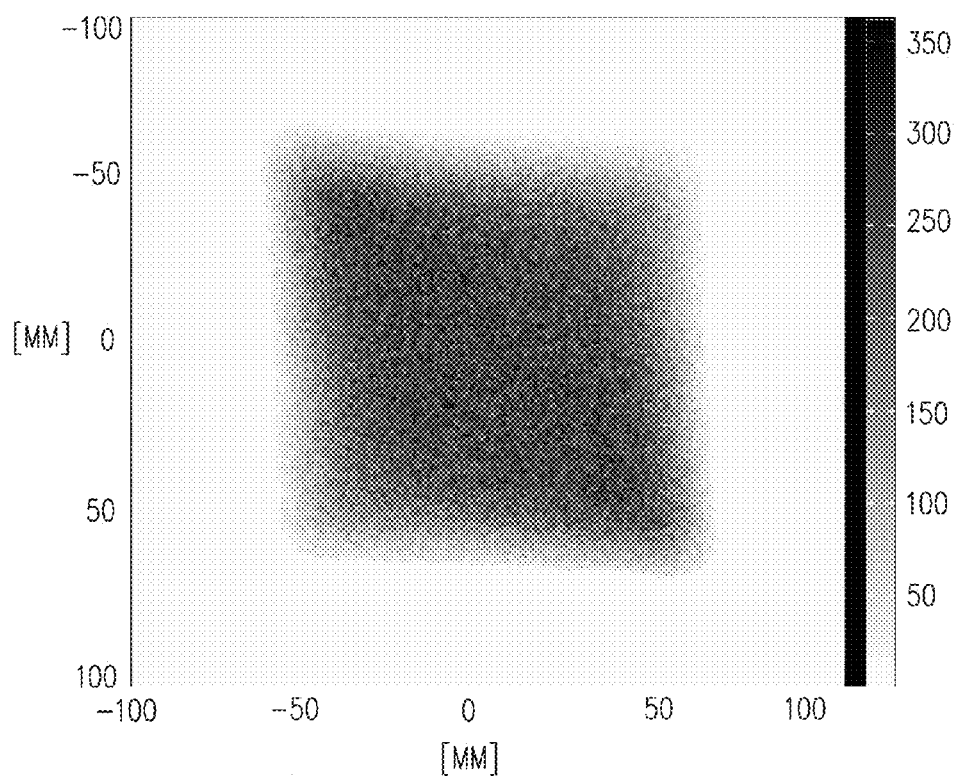
FIG. 4A is a simplified illustration of a reflected radiation flux distribution pattern produced by a part of a photovoltaic solar generator constructed and operative in accordance with yet another preferred embodiment of the invention.
Figure 4B:
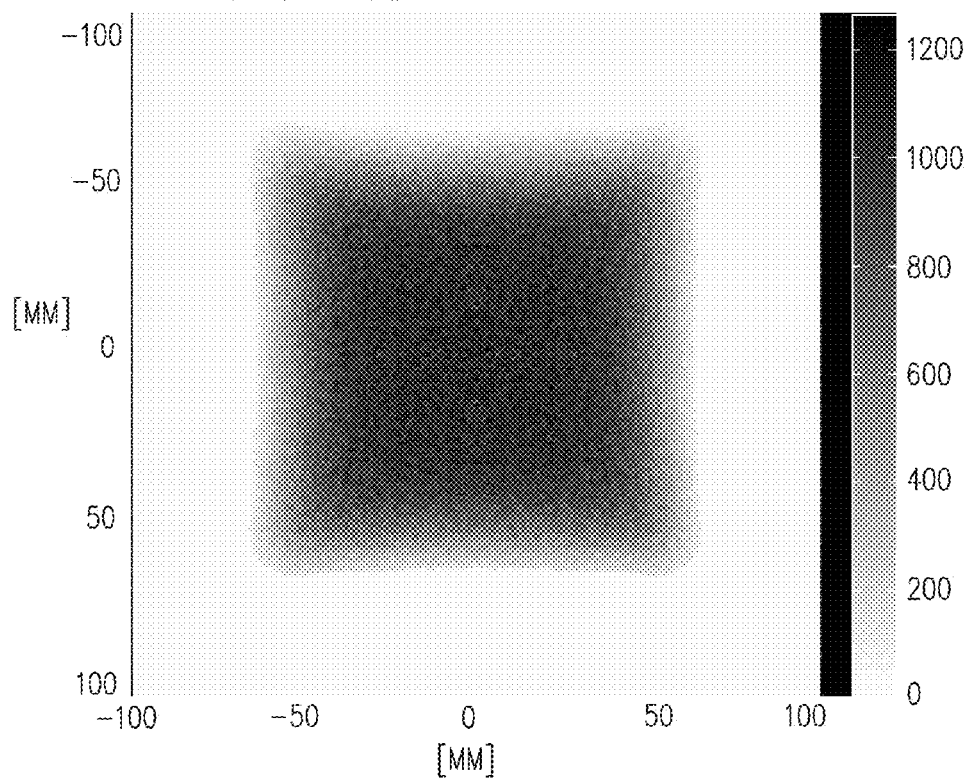
FIG. 4B is a simplified illustration of a reflected radiation flux distribution pattern produced by the photovoltaic solar generator of FIG. 4A.

Reference is now made to FIG. 4A, which is a simplified illustration of a reflected radiation flux distribution pattern produced by a part of a photovoltaic solar generator constructed and operative in accordance with yet another preferred embodiment of the invention, and to FIG. 4B, which is a simplified illustration of a reflected radiation flux distribution pattern produced by the photovoltaic solar generator of FIG. 4A.

In the embodiment of FIGS. 4A and 4B, two perpendicularly intersecting curved axis of a smooth generally concave reflecting surface divide the reflecting surface into four planar symmetric and generally concave reflecting surface segments. Each of the four reflecting surface segments is further divided into a 9×9 matrix of eighty one generally equally sized reflecting surface sub segments.

FIG. 4A illustrates the reflected radiation flux distribution pattern produced by one of the four reflecting surface segments on a photovoltaic module which is part of the solar generator. As seen in FIG. 4A, the reflected radiation flux distribution pattern produced by one of the four reflecting surface segments is generally, but not entirely, uniform over the photovoltaic module. The radiation flux distribution is provided by the eighty one generally overlapping fluxes of radiation produced by the eighty one generally equally sized reflecting surface sub segments of one of the four reflecting surface segments. This arrangement, whereby the photovoltaic module receives eighty one overlapping and generally evenly distributed fluxes of solar radiation, provides for a generally uniform flux of solar radiation on the photovoltaic module even in the case of damage to a limited region of one of the eighty one sub segments.

FIG. 4B illustrates the reflected radiation flux distribution pattern produced by the entire reflecting surface on a photovoltaic module which is part of the solar generator. As seen in FIG. 4B, the reflected radiation flux distribution pattern produced by the entire reflecting surface is generally uniform over the photovoltaic module. This arrangement, whereby the photovoltaic module receives four overlapping and generally evenly distributed fluxes of solar radiation provided by the four reflecting surface segments, provides for a generally uniform flux of solar radiation on the photovoltaic module even in the case of damage to a limited region of one of the four reflecting surface segments.

Reference is now made to FIGS. 4C and 4D, which are together an example of a sequence of MATLAB® instructions operative to calculate part of the shape of the reflecting surface of the generator of FIGS. 4A and 4B, and to FIGS. 4E & 4F, which are together an example of MATLAB® instructions operative to calculate the optical fill factor of the generator of FIGS. 4A-4D.

Using the sequence of MATLAB® instructions shown in FIGS. 4C and 4D, $z_{k,j}$ can be obtained via the differential equations which describe $z_{k,j}=f(x,y)$ as shown hereinabove. The optical fill factor is calculated using the sequence of MATLAB® instructions shown in FIGS. 4E & 4F, which utilizes the calculation off(x,y) shown in FIGS. 4C & 4D.

Figure 4G:
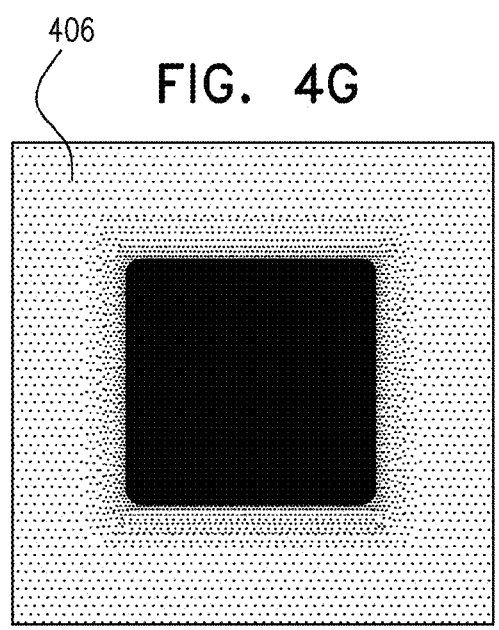
FIG. 4G is a simplified pictorial illustration of a reflected radiation flux distribution pattern produced by the photovoltaic solar generator of FIG. 4A.

FIG. 4G is a simplified pictorial illustration of a reflected radiation flux distribution pattern produced by the photovoltaic solar generator of FIGS. 4A-4F on a flat photovoltaic module. As seen in FIG. 4G, the reflected radiation flux pattern produced on the flat photovoltaic module is generally uniform in intensity over the entirety of photovoltaic module, and tapers off steeply at the edges thereof.

It will be appreciated by persons skilled in the art that the present invention is not limited by what has been particularly shown and described hereinabove. Rather the scope of the present invention includes both combinations and sub-combinations of various features described hereinabove as well as variations and modifications thereof which are not in the prior art.

The invention claimed is:
1. A solar electricity generator including:
   an array of photovoltaic power generating elements; and
   a solar reflecting surface comprising a plurality of continuous, concave solar reflecting surface segments, each of said surface segments being arranged to reflect mutually overlapping fluxes of solar radiation from the sun onto said array of photovoltaic power generating elements.
2. A solar electricity generator according to claim 1 and wherein:
   said plurality of surface segments comprises four continuous, concave solar reflecting surface segments, and wherein said array of photovoltaic power generating elements and said solar reflecting surface are configured such that:
   a flux per area at a point of minimum flux per area on said array is 90% of the flux per area at a point of maximum flux per area;
   an intercept factor of said array is at least 75%; and
   an optical fill factor of said array is at least 70%.
3. A solar electricity generator according to claim 1 and wherein said solar electricity generator also includes a solar tracking system, said solar tracking system being operative to rotate and position said reflecting surface opposite the sun throughout the day.
4. A solar electricity generator according to claim 1 and wherein said solar electricity generator provides a solar radiation concentration ratio of 500-1000.
5. A solar electricity generator according to claim 1 and wherein:
   said solar reflecting surface defines a vertex located at a center of said reflecting surface; and
   said reflecting surface is arranged generally perpendicularly to an axis defined by said vertex and a center of said array.
6. A solar electricity generator according to claim 5 and wherein said array is arranged in a plane which is perpendicular to said axis and is located opposite said solar reflecting surface.
7. A solar electricity generator according to claim 5 and wherein an imaginary plane is defined as perpendicularly intersecting said axis at said vertex, and is tangent to said solar reflecting surface.
8. A solar electricity generator according to claim 1 and wherein said solar reflecting surface segments are symmetric.
9. A solar electricity generator according to claim 5 and wherein said solar reflecting surface segments are symmetrically arranged about said axis.
10. A solar electricity generator according to claim 2 and wherein a 4:1 mapping of reflected solar radiation exists between said four continuous, concave solar reflecting surface segments and said array.
11. A solar electricity generator according to claim 7 and wherein the shape of said reflecting surface is described by a mathematical function $z=f(x,y)$ wherein:

z is the distance between a set of coordinates x,y on said imaginary plane and said reflecting surface;

x and y are the respective latitudinal and longitudinal distances from coordinates x,y to said vertex on said imaginary plane; and f(x,y) is obtained numerically via the differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

wherein:

$$g(x) = \begin{cases} R_x\left(\frac{2x}{L_x} - \frac{1}{2}\right) & \text{for } x \in (0, L_x/2] \\ R_x\left(\frac{2x}{L_x} + \frac{1}{2}\right) & \text{for } x \in [-L_x/2, 0) \end{cases};$$

$$h(y) = \begin{cases} R_y\left(\frac{2y}{L_y} - \frac{1}{2}\right) & \text{for } y \in (0, L_y/2] \\ R_y\left(\frac{2y}{L_y} + \frac{1}{2}\right) & \text{for } y \in [-L_y/2, 0) \end{cases};$$

d is the distance between said vertex and the intersection of said axis with said array;

Rx is the latitudinal length of said array with an addition of a 2 cm margin;

Ry is the longitudinal length of said array with an addition of a 2 cm margin;

Lx is the projected latitudinal length of said reflecting surface on said imaginary plane; and Ly is the projected longitudinal length of said reflecting surface on said imaginary plane.

12. A solar electricity generator including:

an array of photovoltaic power generating elements; and a solar reflecting surface comprising a plurality of solar reflecting surface segments arranged symmetrically about a center of said reflecting surface, each of said surface segments comprising a plurality of continuous, concave solar reflecting surface sub segments, each of said surface sub segments being arranged to reflect mutually overlapping fluxes of solar radiation from the sun onto said array of photovoltaic power generating elements.

13. A solar electricity generator according to claim 12 and wherein:

said plurality of surface segments comprises four solar reflecting surface segments, each of said surface segments comprising four continuous, concave solar reflecting surface sub segments, and wherein said array of photovoltaic power generating elements and said solar reflecting surface are configured such that:

a flux per area at a point of minimum flux per area on said array is 60% of the flux per area at a point of maximum flux per area;

an intercept factor of said array is at least 80%; and an optical fill factor of said array is at least 60%.

14. A solar electricity generator according to claim 13 and wherein a 16:1 mapping of reflected solar radiation exists between said reflecting surface sub segments and said array.

15. A solar electricity generator according to claim 12 and wherein:

said plurality of surface segments comprises four solar reflecting surface segments, each of said surface segments comprising eighty-one continuous, concave solar reflecting surface sub segments, and wherein said array of photovoltaic power generating elements and said solar reflecting surface are configured such that:

a flux per area at a point of minimum flux per area on said array is 60% of the flux per area at a point of maximum flux per area;

an intercept factor of said array is at least 80%; and an optical fill factor of said array is at least 60%.

16. A solar electricity generator according to claim 15 and wherein a 81:1 mapping of reflected solar radiation exists between said reflecting surface sub segments and said array.

17. A solar electricity generator according to claim 12 and wherein said solar electricity generator also includes a solar tracking system, said solar tracking system being operative to rotate and position said reflecting surface opposite the sun throughout the day.

18. A solar electricity generator according to claim 12 and wherein said solar electricity generator provides a solar radiation concentration ratio of 500-1000.

19. A solar electricity generator according to claim 12 and wherein:

said solar reflecting surface defines a vertex located at a center of said reflecting surface; and said reflecting surface is arranged generally perpendicularly to an axis defined by said vertex and a center of said array.

20. A solar electricity generator according to claim 19 and wherein said array is arranged in a plane which is perpendicular to said axis and is located opposite said solar reflecting surface.

21. A solar electricity generator according to claim 19 and wherein an imaginary plane is defined as perpendicularly intersecting said axis at said vertex, and is tangent to said solar reflecting surface.

22. A solar electricity generator according to claim 12 and wherein said solar reflecting surface segments are symmetric.

23. A solar electricity generator according to claim 21 and wherein for a matrix of n by m surface sub segments of a surface segment, wherein the coordinates of an individual surface sub segment are denoted as k,j, where k is the order of said individual surface sub segment between 1 and n and j is the order of said individual surface sub segment between 1 and m, the shape of the individual surface sub segment at coordinates k,j is described by a mathematical function z=f(x,y) wherein:

z is the distance between a set of coordinates x,y on said imaginary plane and said reflecting surface;

x and y are the respective latitudinal and longitudinal distances from coordinates x,y to said vertex on said imaginary plane; and f(x,y) is obtained numerically via the differential equations:

$$\frac{\partial f(x,y)}{\partial x} = \frac{x - g(x)}{d - f(x,y) + \sqrt{(x-g(x))^2 + (y-h(y))^2 + (d-f(x,y))^2}}$$

$$\frac{\partial f(x,y)}{\partial y} = \frac{y - h(y)}{d - f(x,y) + \sqrt{(x-g(x))^2 + (y-h(y))^2 + (d-f(x,y))^2}};$$

-continued wherein:

$$g(x) = \begin{cases} (-1)^k R_x\left(k - \frac{1}{2} - \frac{2nx}{L_x}\right) & \text{for } x \in \left[\frac{(k-1)L}{2n}, \frac{kL_x}{2n}\right], k = 1, 2, \ldots n \\ (-1)^k R_x\left(\frac{1}{2} - k - \frac{2nx}{L_x}\right) & \text{for } x \in \left[-\frac{kL_x}{2n}, -\frac{(k-1)L_x}{2n}\right), k = 1, 2, \ldots n \end{cases};$$

$$h(y) = \begin{cases} (-1)^j R_y\left(j - \frac{1}{2} - \frac{2my}{L_y}\right) & \text{for } y \in \left[\frac{(j-1)L_y}{2m}, \frac{jL_y}{2m}\right], j = 1, 2, \ldots m \\ (-1)^j R_y\left(\frac{1}{2} - j - \frac{2my}{L_y}\right) & \text{for } y \in \left[-\frac{jL_y}{2m}, -\frac{(j-1)L_y}{2m}\right), \end{cases};$$
$$j = 1, 2, \ldots m$$

d is the distance between said vertex and the intersection of said axis with said array;

Rx is the latitudinal length of said array with an addition of a 2 cm margin;

Ry is the longitudinal length of said array with an addition of a 2 cm margin;

Lx is the projected latitudinal length of said reflecting surface on said imaginary plane; and Ly is the projected longitudinal length of said reflecting surface on said imaginary plane.

24. The solar electricity generator of claim 1, wherein each of said surface segments is larger than the array of photovoltaic power generating elements.

25. A solar electricity generator comprising:
an array of photovoltaic power generating elements; and
a solar reflecting surface comprising a plurality of continuous, concave solar reflecting surface segments, wherein each of the surface segments is configured to reflect solar radiation onto the array of photovoltaic power generating elements to produce a flux pattern that is uniform in intensity across the array.

26. The solar electricity generator of claim 25, wherein the plurality of surface segments comprises four continuous, concave solar reflecting surface segments, and wherein the array of photovoltaic power generating elements and the solar reflecting surface are configured such that:
a flux per area at a point of minimum flux per area on said array is 90% of the flux per area at a point of maximum flux per area;
an intercept factor of said array is at least 75%; and
an optical fill factor of said array is at least 70%.

27. The solar electricity generator of claim 25, wherein the solar reflecting surface segments are symmetric.

28. The solar electricity generator of claim 25, wherein the solar reflecting surface defines a vertex located at a center of said reflecting surface, and wherein the reflecting surface is arranged generally perpendicularly to an axis defined by the vertex and a center of the array.

29. The solar electricity generator of claim 28, wherein the solar reflecting surface segments are symmetrically arranged about the axis.

30. The solar electricity generator of claim 25, wherein each of said surface segments is larger than the array of photovoltaic power generating elements.

* * * * *